(12) United States Patent
Hendricks

(10) Patent No.: US 9,576,408 B2
(45) Date of Patent: Feb. 21, 2017

(54) BATTERY POWERED TRAINABLE REMOTE GARAGE DOOR OPENER MODULE

(71) Applicant: Gentex Corporation, Zeeland, MI (US)

(72) Inventor: Michael G. Hendricks, Wyoming, MI (US)

(73) Assignee: GENTEX CORPORATION, Zeeland, MI (US)

(*) Notice: Subject to any disclaimer, the term of this patent is extended or adjusted under 35 U.S.C. 154(b) by 0 days.

(21) Appl. No.: 14/810,662

(22) Filed: Jul. 28, 2015

(65) Prior Publication Data

US 2016/0037664 A1   Feb. 4, 2016

Related U.S. Application Data

(60) Provisional application No. 62/030,846, filed on Jul. 30, 2014.

(51) Int. Cl.
*B60R 9/04* (2006.01)
*G07C 9/00* (2006.01)

(52) U.S. Cl.
CPC ....... *G07C 9/00007* (2013.01); *G07C 9/00182* (2013.01); *G07C 9/00944* (2013.01); *G07C 2009/00928* (2013.01)

(58) Field of Classification Search
CPC .... B60R 1/12; B60R 2001/1215; B60R 11/04; B60R 2001/1223; B60R 1/1207; G07C 2009/00928; G07C 2009/00793; G07C 9/00182; G08C 17/02; E05Y 2900/106
(Continued)

(56) References Cited

U.S. PATENT DOCUMENTS 4,241,870 A    12/1980 Marcus
4,867,498 A *  9/1989 Delphia ............... B60Q 3/0263
                                         224/311
(Continued)

FOREIGN PATENT DOCUMENTS

CN      102063752 A    5/2011
RU       2214065 C2   10/2003
(Continued)

OTHER PUBLICATIONS

Patent Cooperation Treaty, International Searching Authority, International Search Report, Written Opinion of the International Searching Authority and Notification of Transmittal, Mar. 19, 2015, 7 pages.
(Continued)

*Primary Examiner* — Kiran B Patel
(74) *Attorney, Agent, or Firm* — Price Heneveld LLP; Bradley D. Johnson

(57) ABSTRACT

A remote garage door opener module for after-market assembly into a vehicle for transmitting signals to a garage door opener includes a bezel positionable against a headliner of the vehicle along an interior surface thereof in a position over a hole in the headliner. The module further includes a housing enclosing a power source and electronic circuitry for transmitting the signals. The housing extends away from a first side of the bezel and is positionable at least partially through the hole in the headliner. The module further includes a button exposed at a second side of the bezel and coupled to the electronic circuitry and a mounting element selectively engageable with the headliner adjacent the hole and coupled with one of the housing or the bezel for coupling the module with the headliner.

10 Claims, 17 Drawing Sheets

(58) Field of Classification Search
USPC ...... 296/37.7, 37.8; 160/188, 201; 307/10.1; 341/176
See application file for complete search history.

(56) References Cited

U.S. PATENT DOCUMENTS

| | | | |
|---|---|---|---|
| 5,267,761 A * | 12/1993 | Curtindale | B60R 7/04 292/81 |
| 5,388,880 A * | 2/1995 | Kinane | B60R 11/0264 224/311 |
| 5,442,340 A | 8/1995 | Dykema | |
| 5,479,155 A | 12/1995 | Zeinstra et al. | |
| 5,522,638 A * | 6/1996 | Falcoff | B60R 7/04 224/282 |
| 5,583,485 A | 12/1996 | Van Lente et al. | |
| 5,614,891 A | 3/1997 | Zeinstra et al. | |
| 5,619,190 A | 4/1997 | Duckworth et al. | |
| 5,627,529 A | 5/1997 | Duckworth et al. | |
| 5,646,701 A | 7/1997 | Duckworth et al. | |
| 5,661,804 A | 8/1997 | Dykema et al. | |
| 5,686,903 A | 11/1997 | Duckworth et al. | |
| 5,699,054 A | 12/1997 | Duckworth | |
| 5,699,055 A | 12/1997 | Dykema et al. | |
| 5,793,300 A | 8/1998 | Suman et al. | |
| 5,854,593 A | 12/1998 | Dykema et al. | |
| 5,873,597 A * | 2/1999 | Sim | B60N 3/002 280/727 |
| 5,887,929 A * | 3/1999 | Miller | B60R 7/04 296/37.7 |
| 5,887,939 A * | 3/1999 | Yamaguchi | B62D 65/04 296/146.7 |
| 5,903,226 A | 5/1999 | Suman et al. | |
| 5,940,000 A | 8/1999 | Dykema | |
| 6,062,623 A * | 5/2000 | Lemmen | B60R 7/04 224/282 |
| 6,091,343 A | 7/2000 | Dykema et al. | |
| 6,116,675 A * | 9/2000 | Iwasawa | B60N 3/12 224/309 |
| 6,124,822 A * | 9/2000 | Wu | B60R 11/0264 296/37.7 |
| 6,412,848 B1 * | 7/2002 | Ceccanese | B60K 35/00 224/311 |
| 6,957,839 B1 * | 10/2005 | Tiesler | B60R 7/04 224/311 |
| 6,965,757 B2 | 11/2005 | Eray | |
| 6,978,126 B1 | 12/2005 | Blaker et al. | |
| 7,098,411 B1 * | 8/2006 | McConnell | H01H 13/83 200/310 |
| 7,197,278 B2 | 3/2007 | Harwood et al. | |
| 7,469,129 B2 | 12/2008 | Blaker et al. | |
| 7,532,965 B2 | 5/2009 | Robillard et al. | |
| 7,778,604 B2 | 8/2010 | Bauman et al. | |
| 7,786,843 B2 | 8/2010 | Witkowski | |
| 7,864,070 B2 | 1/2011 | Witkowski et al. | |
| 7,889,050 B2 | 2/2011 | Witkowski | |
| 7,911,358 B2 | 3/2011 | Bos et al. | |
| 7,970,446 B2 | 6/2011 | Witkowski et al. | |
| 8,000,667 B2 | 8/2011 | Witkowski et al. | |
| 8,049,595 B2 | 11/2011 | Olson et al. | |
| 8,165,527 B2 | 4/2012 | Sims et al. | |
| 8,174,357 B2 | 5/2012 | Geerlings et al. | |
| 8,253,528 B2 | 8/2012 | Blaker | |
| 8,264,333 B2 | 9/2012 | Blaker et al. | |
| 8,384,580 B2 | 2/2013 | Witkowski et al. | |
| 8,494,449 B2 | 7/2013 | Witkowski et al. | |
| 8,531,266 B2 | 9/2013 | Shearer et al. | |
| 8,643,481 B2 | 2/2014 | Campbell et al. | |
| 8,760,267 B2 | 6/2014 | Bos et al. | |
| 2002/0140289 A1 * | 10/2002 | McConnell | B60R 11/02 307/10.1 |
| 2003/0169522 A1 * | 9/2003 | Schofield | B60R 1/04 359/876 |
| 2007/0167138 A1 | 7/2007 | Bauman et al. | |
| 2008/0062000 A1 | 3/2008 | Styers et al. | |
| 2009/0315751 A1 | 12/2009 | Bennie et al. | |
| 2010/0171588 A1 | 7/2010 | Chutorash et al. | |
| 2011/0025456 A1 | 2/2011 | Bos et al. | |
| 2011/0248866 A1 | 10/2011 | Chutorash et al. | |
| 2013/0151977 A1 | 6/2013 | Arteaga-King et al. | |
| 2014/0009263 A1 | 1/2014 | Shearer et al. | |
| 2014/0111315 A1 | 4/2014 | Geerlings et al. | |
| 2014/0118119 A1 | 5/2014 | Geerlings et al. | |
| 2016/0062513 A1 * | 3/2016 | Turnbull | B60K 37/00 345/174 |

FOREIGN PATENT DOCUMENTS

| | | |
|---|---|---|
| RU | 2402074 C2 | 10/2010 |
| WO | 2007101619 A1 | 9/2007 |

OTHER PUBLICATIONS

International Search Report and Written Opinion of the International Searching Authority, or the Declaration, dated Nov. 12, 2015 for International Application No. PCT/US2015/042456, filed on Jul. 28, 2015.

* cited by examiner

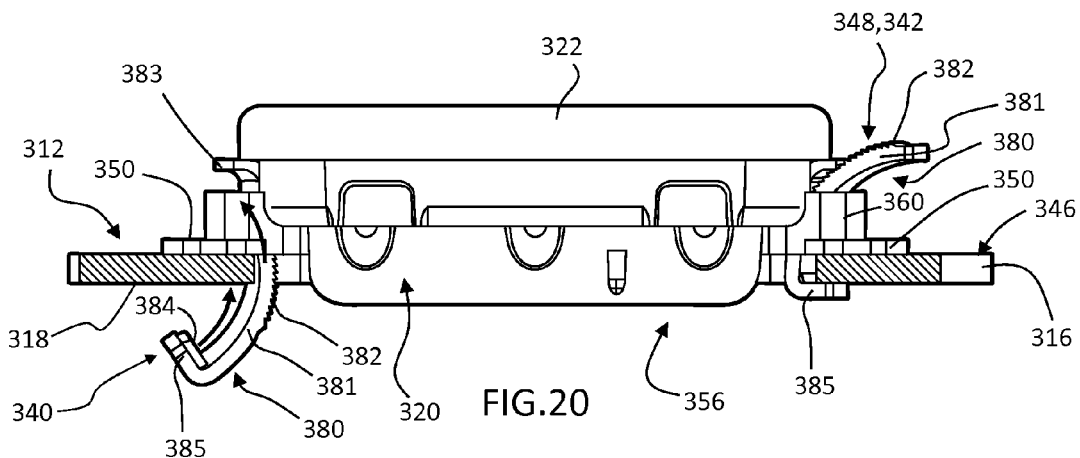
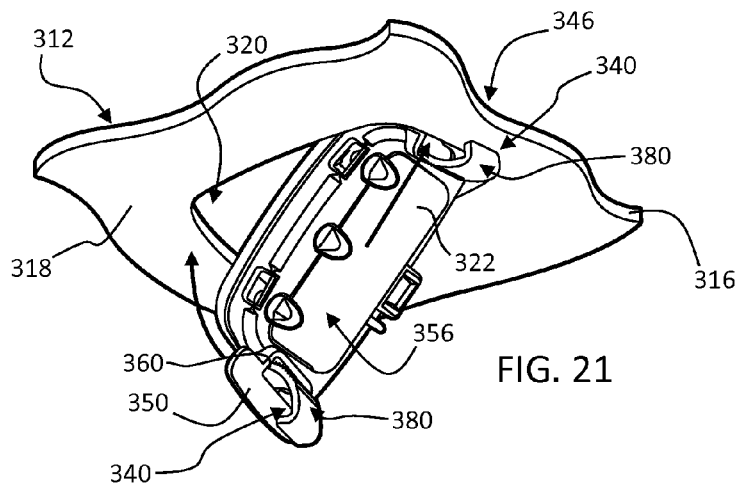
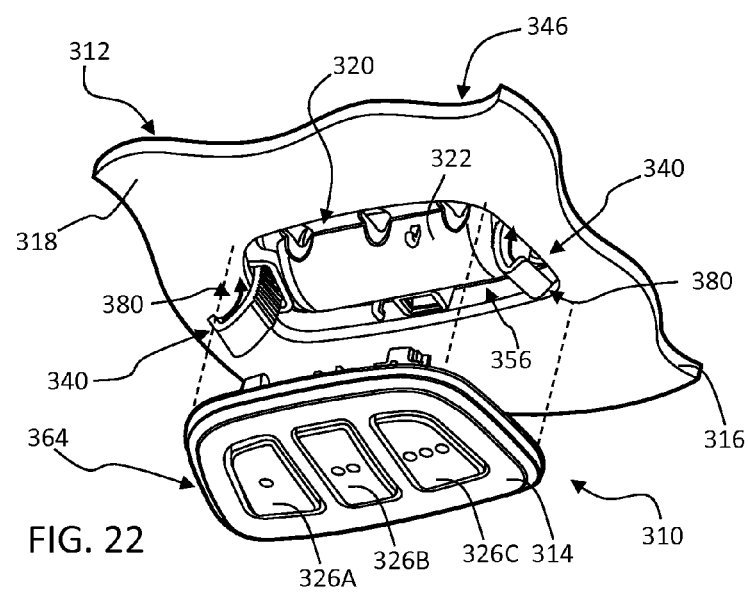

BATTERY POWERED TRAINABLE REMOTE GARAGE DOOR OPENER MODULE

CROSS REFERENCE TO RELATED APPLICATION

This application claims priority under 35 U.S.C. §119(e) to U.S. Provisional Patent Application No. 62/030,846, filed on Jul. 30, 2014, entitled "BATTERY POWERED TRAINABLE REMOTE GARAGE DOOR OPENER MODULE," which is incorporated herein by reference in its entirety.

BACKGROUND OF THE DISCLOSURE

The present disclosure generally relates to a remote garage door opener module for after-market assembly into a vehicle.

Remote garage door openers in the form of trainable remote garage door openers have been previously-available as factory-installed, in-vehicle remote garage door openers. Such remote garage door openers are integrated into a vehicle, such as by being generally permanently mounted on the headliner, a windshield visor, a rearview mirror, or the like. Further, the openers can communicate directly with a garage door opener and can be in the form of a trainable remote garage door opener that can learn the signal protocols of a remote transmitter that comes with such a garage door opener and later transmit a signal having those protocols. As such, they can accommodate many different garage door opener protocols using multiple codes and signaling frequencies to provide integrated vehicle door access.

Previously, such remote garage door openers were configured to receive power from the vehicle battery and/or vehicle ignition and had mounting structures and wire routing directed toward being included with the vehicle during assembly thereof. Therefore, further advances are desired.

SUMMARY OF THE PRESENT DISCLOSURE

According to one aspect of the present disclosure, a remote garage door opener module for assembly into a vehicle and transmitting signals to a garage door opener include a bezel positionable against a headliner of the vehicle along an interior surface thereof in a position over a hole in the headliner. The module further includes a housing enclosing a power source and electronic circuitry for transmitting the signals. The housing extends away from a first side of the bezel and is positionable at least partially through the hole in the headliner. The module further includes a button exposed at a second side of the bezel and coupled to the electronic circuitry and a mounting element selectively engageable with the headliner adjacent the hole and coupled with one of the housing or the bezel for coupling the module with the headliner.

According to another aspect of the present disclosure, a remote garage door opener module for assembly into a vehicle and transmitting signals to a garage door opener includes a housing enclosing a power source and electronic circuitry for transmitting the signals. The housing is positionable at least partially through the hole in the headliner. A flange extends integrally outwardly from the housing and defines therewith a first surface positionable over the hole in the headliner. The module further includes a first mounting tab having a first threaded hole therein and a first actuation element including a screw and operably coupling the first mounting tab with the housing by engagement of the screw with the threaded hole.

According to another aspect of the present disclosure, a method for installing a remote garage door opener module in a vehicle includes forming a hole in a headliner of the vehicle with the hole extending between a first side of the headliner disposed toward the interior of the vehicle and a second side of the headliner disposed toward a roof panel of the vehicle. The method further includes positioning at least a housing portion of a remote garage door opener module within the hole with a retention portion thereof in contact with the first side of the headliner and engaging a mounting element operably coupled with the housing portion of the remote garage door opener module with the second side of the headliner adjacent the hole to couple the module with the headliner.

These and other aspects, objects, and features of the present disclosure will be understood and appreciated by those skilled in the art upon studying the following specification, claims, and appended drawings. It will also be understood that features of each embodiment disclosed herein may be used in conjunction with, or as a replacement for, features of the other embodiments.

BRIEF DESCRIPTION OF THE DRAWINGS

In the drawings:

FIG. 20 shows a front view of another variation of the remote garage door opener module of FIG. 1 during a step of assembly thereof with a portion of a vehicle headliner;

FIGS. 21 and 22 show perspective views of the remote garage door opener module of FIG. 21 during successive steps of assembly with a vehicle headliner;

DETAILED DESCRIPTION OF EMBODIMENTS

Figure 1:
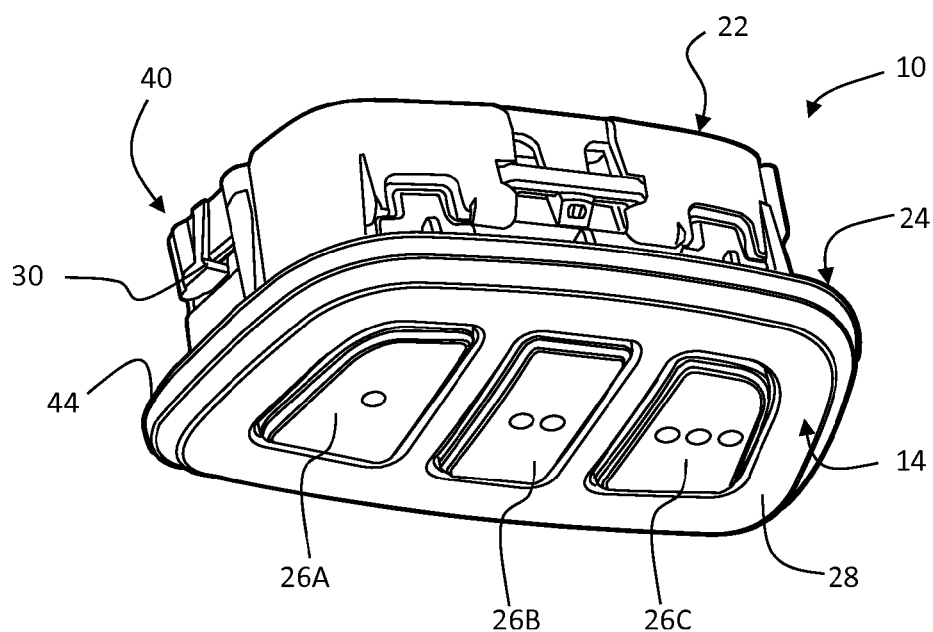
FIG. 1 shows a perspective view of a remote garage door opener module.

For purposes of description herein, the terms "upper," "lower," "right," "left," "rear," "front," "vertical," "horizontal," and derivatives thereof shall relate to the disclosure as oriented in FIG. 1. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise. Further, unless otherwise specified, reference numbers having the same last two digits between various series of numbers (e.g., 000s, 100s, 200s, etc.) are meant to refer to common features among, for example, various embodiments disclosed herein.

Figure 2:
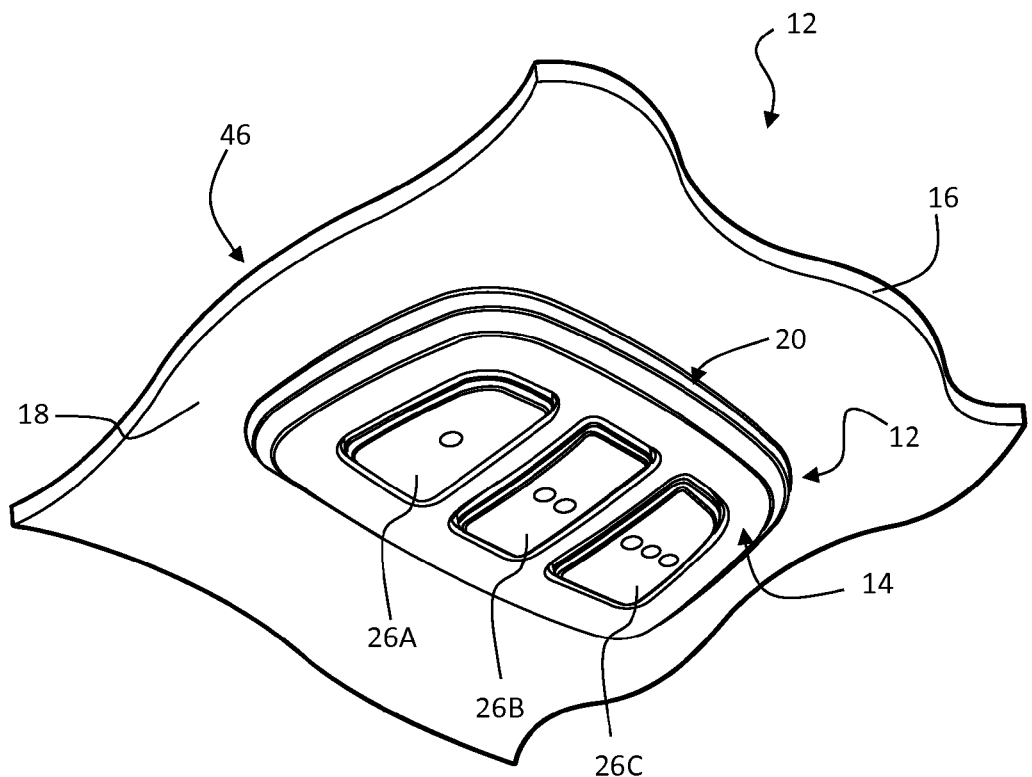
FIG. 2 shows a perspective view of the remote garage door opener module of FIG. 1 assembled with a portion of a vehicle headliner.

Referring to FIGS. 1 and 2, reference numeral 10 generally designates a remote garage door opener module for assembly or installation into a vehicle 12. The module 10 is capable of transmitting signals to a garage door opener and includes a bezel 14 disposable against a headliner 16 of the vehicle 12 along an interior 18 thereof in a position over a hole 20 in the headliner 16. The module 10 further includes a housing 22 enclosing a power source and electronic circuitry for transmitting the signals. The housing 22 extends away from a first side 24 of the bezel 14 and is positionable at least partially through the hole 20 in the headliner 16. A button 26 is exposed at a second side 28 of the bezel 14 and is coupled to the electronic circuitry. The module 10 further includes a mounting element 30 selectively engageable with the headliner 16 adjacent the hole 20 and coupled with one of the housing 22 or the bezel 14 for coupling the module 10 with the headliner 16.

Figure 3:
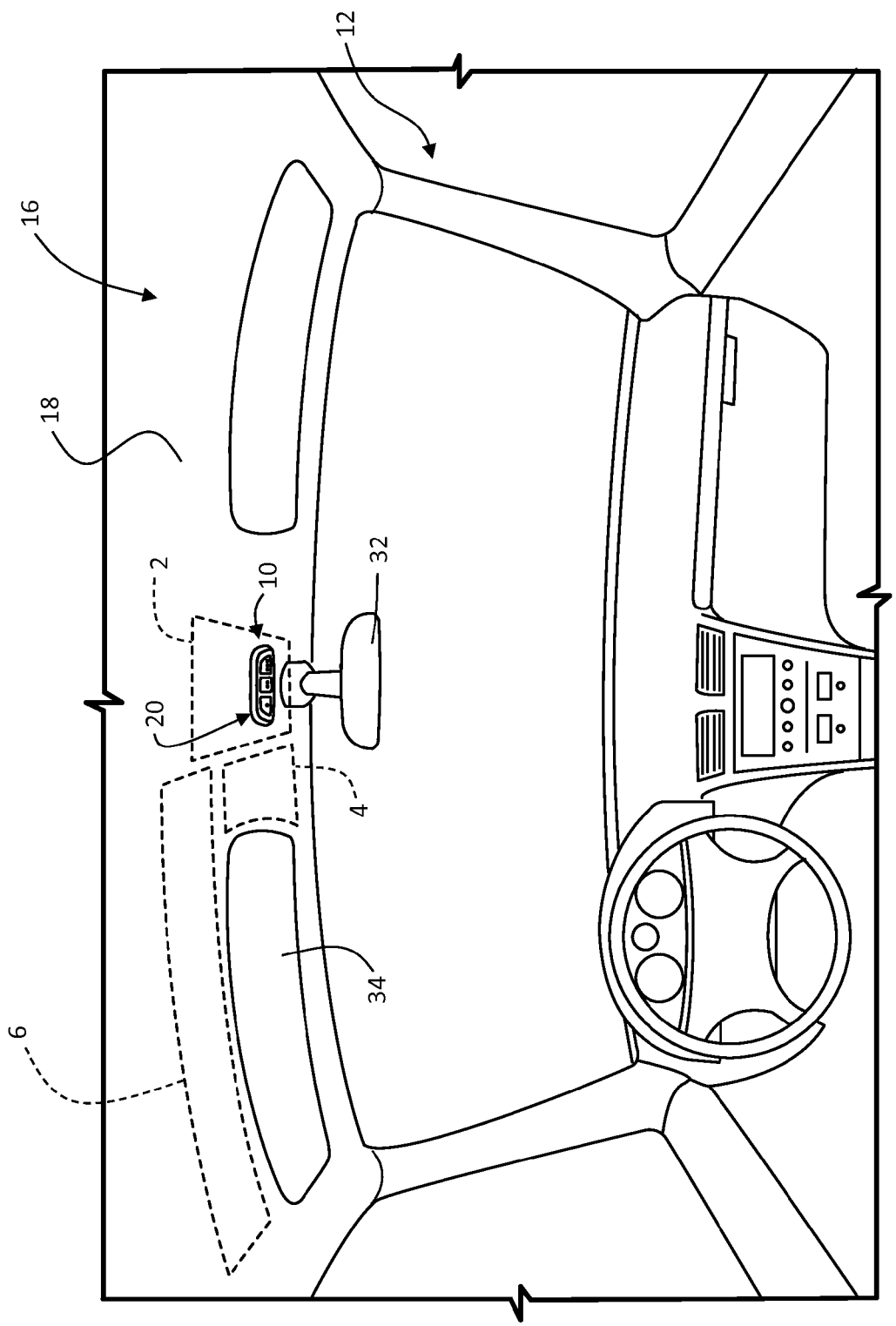
FIG. 3 shows an interior of a vehicle having the remote garage door opener module of FIG. 1 installed in a headliner thereof.

As shown in FIG. 3, module 10 can be assembled with the headliner 16 of the vehicle 12 to provide an integrated in-vehicle remote garage door opener. Such remote garage door openers are generally known, such as the HOMELINK® trainable remote garage door opener available from Gentex Corporation of Zeeland, Mich. Such in-vehicle remote garage door openers, including installed module 10 of FIG. 3, communicate directly with a garage door opener and, more specifically, can be in the form of a trainable remote garage door opener that can learn the signal protocols of a remote transmitter that comes with such a garage door opener and later transmit a signal having those protocols. As such, the module 10 can accommodate many different garage door opener protocols using multiple codes and signaling frequencies to provide integrated vehicle door access. Although primarily used for garage door control, the module 10 can also be capable of other remote control, such as the control of lighting, gates, security systems, etc. Previously, such remote garage door openers were configured to receive power from the vehicle battery and/or vehicle ignition. The module 10, on the other hand, includes a dedicated power source in the form of a battery, as mentioned above, contained within the housing 22. This configuration, along with the incorporation of one of the various mounting elements, as described further below, gives the module 10 the capability of functioning as a stand-alone unit that can be installed in the vehicle 12 to give the appearance and benefits of other available in vehicle remote garage door openers. Such installation may be done without removal of the headliner 16 of the vehicle 12 or connection of the module 10 with the electrical system of the vehicle 12, making installation of module 10 well-suited for an after-market setting, although some manufacturers may find the installation of module 10 into a vehicle 12 to be beneficial in other installation settings, including original manufacturing.

As further shown in FIG. 3, the module 10 can be installed along the headliner 16 on the vehicle 12 in a number of locations to provide easy access thereof to an occupant or user thereof. The module 10 is shown in FIG. 3 as being installed in a central location of an area 2 along the headliner 16 and adjacent a rearview mirror 32. In another example, a ceiling-mounted console is present along the headliner 16 within the area 2. The module 10 can be installed in an area 4 between the area 2 and a visor 34 of the vehicle 12. As a further alternative, the module 10 can be installed within the headliner 16 at a location 6 rearward of the visor 34. Other locations for the installations of the module 10 are possible and can include any location in which the module 10 would be accessible to a user thereof and in which appropriate space is available between the interior 18 of the headliner 16 and an associated roof panel of the vehicle 12 to accommodate a portion of the housing 22 therein.

Figure 4:
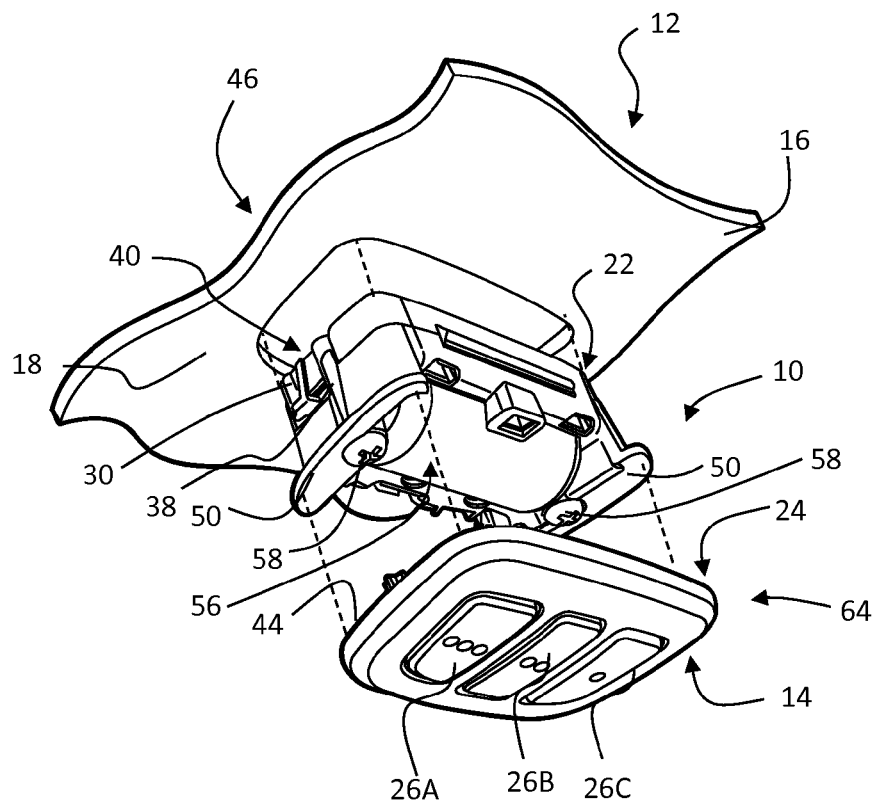
FIG. 4 shows an assembly view of a variation of the remote garage door opener module of FIG. 1 during a step of assembly thereof with a portion of a vehicle headliner.
Figure 5:
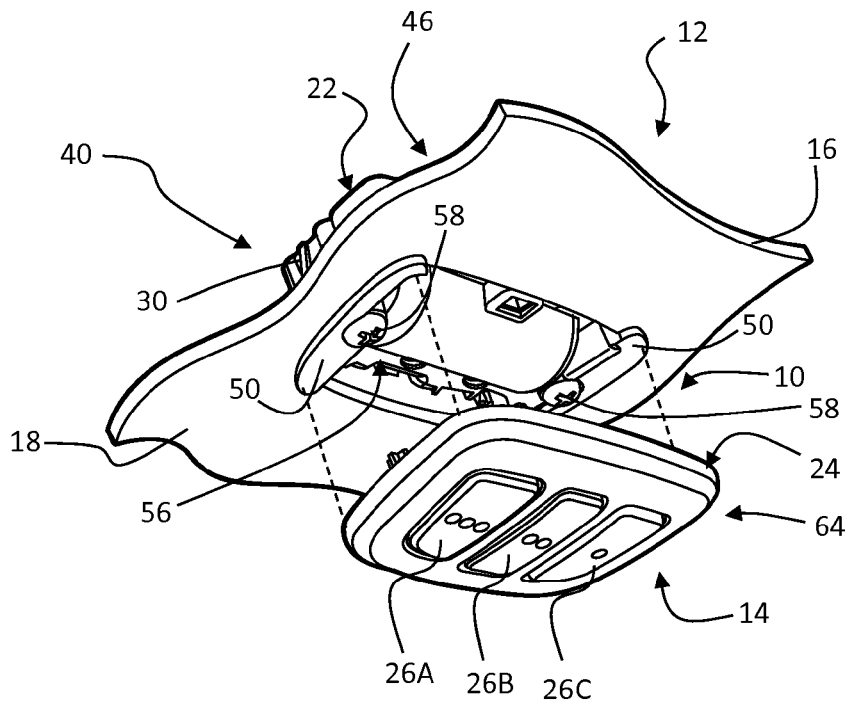
FIG. 5 shows an assembly view of the remote garage door opener module of FIG. 4 during a subsequent assembly step.
Figure 6:
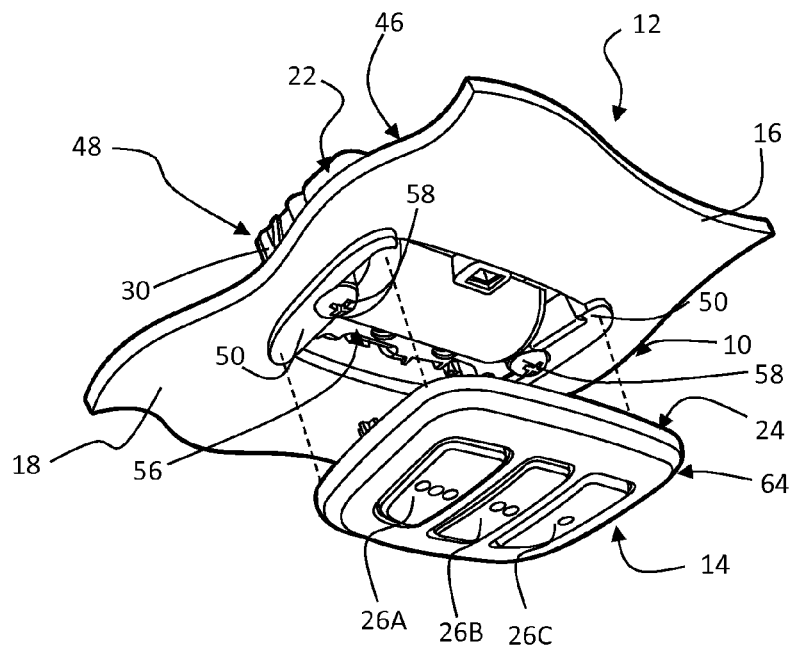
FIG. 6 shows an assembly view of the remote garage door opener module of FIG. 4 during a subsequent assembly step.
Figure 7:
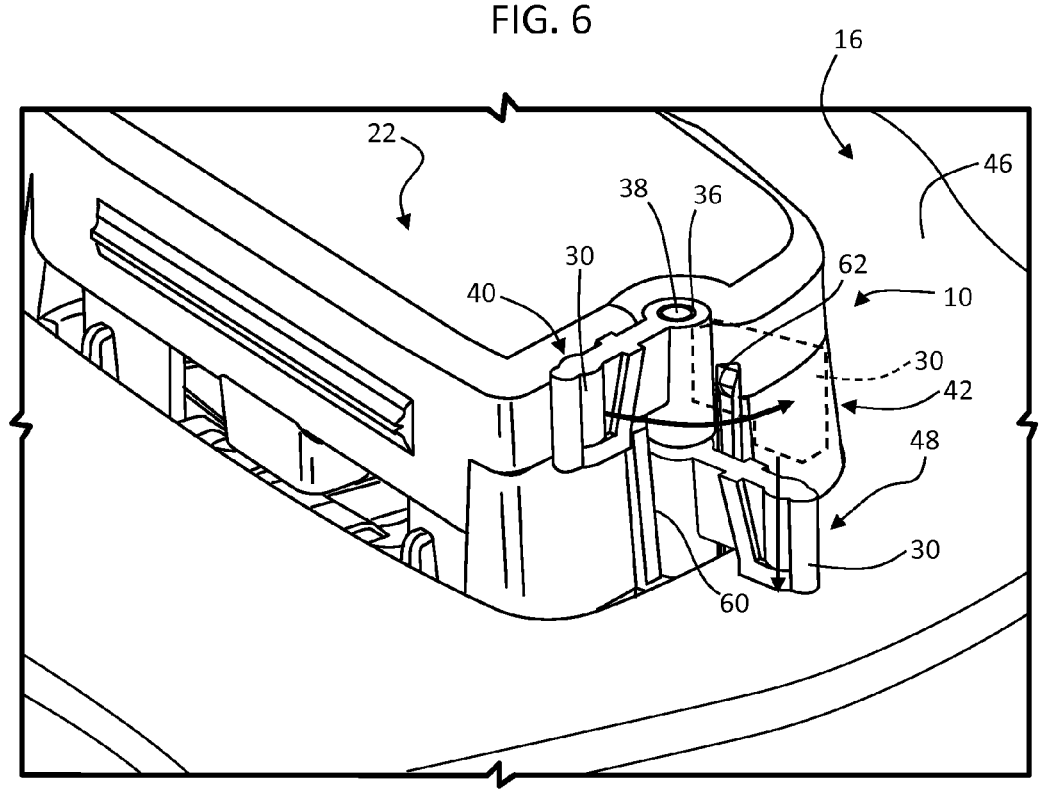
FIG. 7 shows a detailed view of the remote garage door opener module of FIG. 4 during a movement sequence of a mounting element thereof.
Figure 8A:
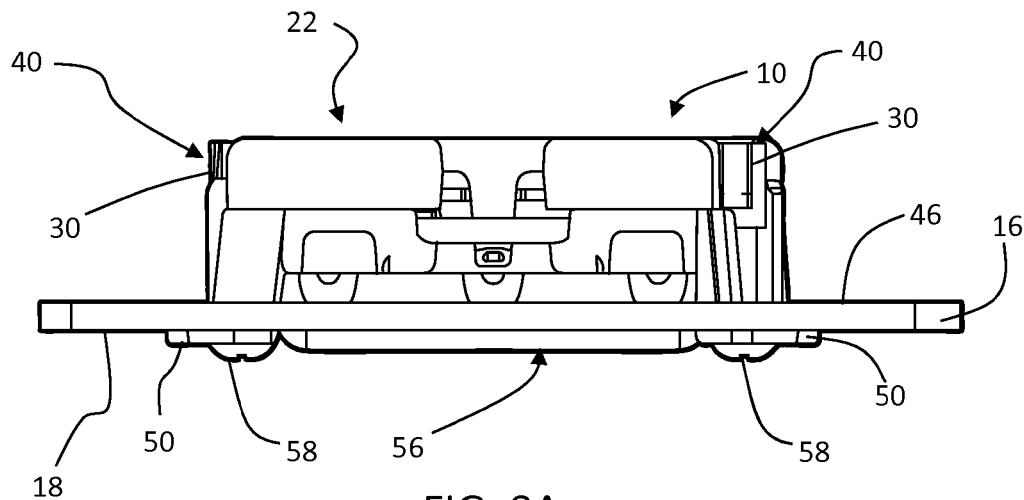
FIG. 8A shows a front view of the remote garage door opener module of FIG. 4 during a step of the movement sequence depicted in FIG. 7.
Figure 8B:
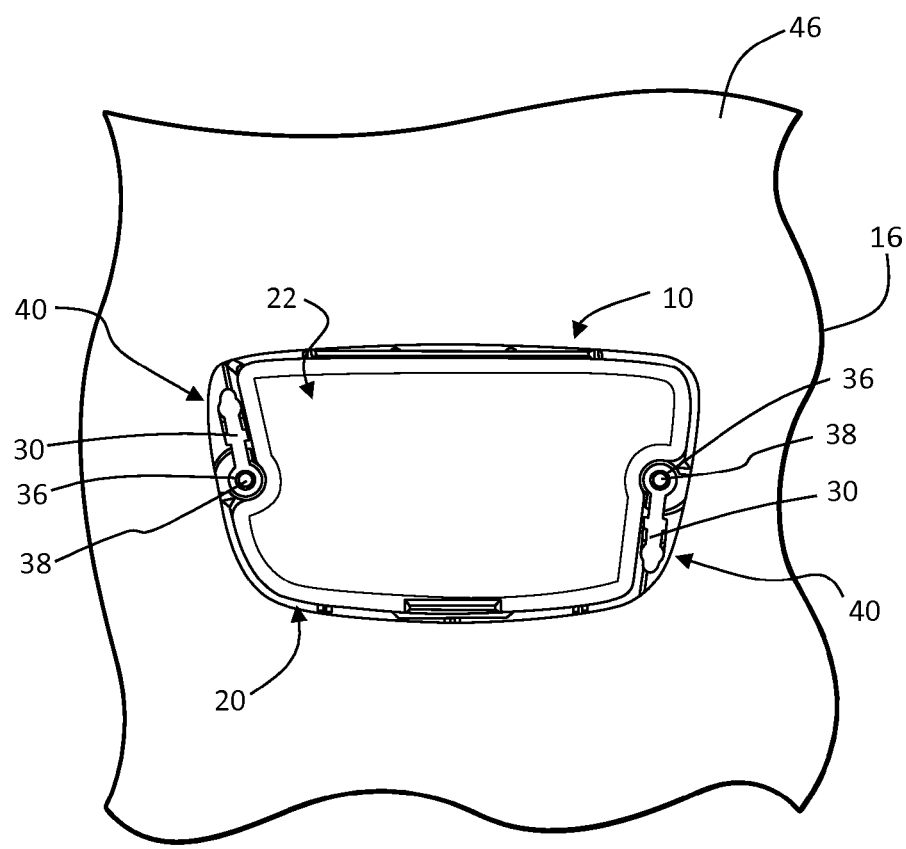
FIG. 8B shows a top view of the remote garage door opener module during the movement sequence step of FIG. 8A.

Returning again to FIG. 1, and with further reference to FIGS. 4-11, an example of the module 10 is shown in which the mounting element is in the form of a tab 30 having a threaded hole 36 therein (as illustrated in FIG. 7) and coupled with the housing 22 by an actuation element in the form of a screw 38. As illustrated herein, and in particular in FIGS. 6-11, the tab 30 is shown as being capable of movement between a retracted position 40 and an extended position 42. As illustrated, in the retracted position 40, the tab 30 is disposed inward of an outer periphery 44 of the bezel 14 and adjacent to or in contact with a portion of the housing 22. Such a configuration allows for the housing 22 to fit through the hole 20 in the headliner 16 such that the module 10 can be installed over the interior 18 of the headliner 16, as shown in FIGS. 4 and 5. As shown in FIGS. 1 and 2, for example, the bezel 14 extends outwardly to surround the housing 22 such that the outer periphery 44 of the bezel 14 can be disposed outwardly of the hole 20, allowing the bezel 14 to obscure the hole 20 from view once the module 10 is installed in the vehicle 12. Accordingly, the module 10 can be installed in a hole 20 that has a size between that of the outer periphery 44 of the bezel 14 and of the housing 22. As such, by positioning the tab 30 such that in the retracted position 40 it is disposed within the outer periphery 44, the presence of the tab 30 does not obstruct movement of the housing 22 into the hole 20.

When the tab 30 is moved to the extended position 42, as illustrated in FIGS. 6 and 7, it can extend outwardly from the housing 22 and over an exterior surface 46 of the headliner 16 opposite the interior 18 such that the housing 22 is at least obstructed from movement from out of the hole 20. It is noted that in the present example, the retracted position 40 of the tab 30 can further be such that the tab 30 is disposed inwardly of an outer edge flange 50 such that the housing 22 can be assembled into the hole 20, as shown in FIG. 6, with an inner retention surface of the flange 50 contacting the interior 18 of the headliner 16. In an example, when in the retracted position 40, the tab 30 can be disposed inwardly of the outer periphery 44 of the bezel 14, or alternatively, inwardly of the flange 50 by at least about 2 mm.

Figure 10:
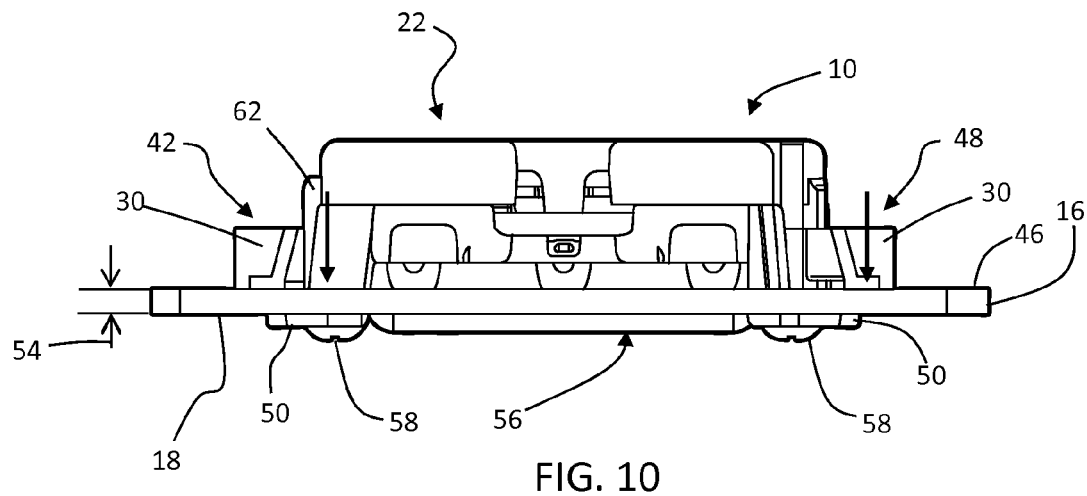
FIG. 10 shows a front view of the remote garage door opener module of FIG. 4 during a subsequent step of the movement sequence depicted in FIG. 7.

As shown in FIGS. 7 and 10, the tab 30 is further moveable into an engaged position 48 in which the tab 30 contacts the surface 46 of the headliner 16 such that a portion of the headliner 16 is captured between the tab 30 and another portion of the module 10 in contact with the interior 18 of the headliner 16. In the present example, such a feature can include a flange 50 that extends integrally from the housing 22 in an outward direction (i.e., toward the outer periphery 44 of the bezel 14), as shown in FIG. 10.

With reference again to FIGS. 7-10, when in the retracted position 40, the tab 30 can be positioned at a height 52 that is greater than a thickness 54 of the headliner 16, such that the tab 30 or another variation of a mounting element, can according to various examples described further herein, can freely move to the engaged position 48, including movement through the extended position 42, if applicable. Further, the height 52 of the tab 30 in the retracted position 40 can be such that the tab 30 can be usable to couple module 10 with various headliners 16 within a broad range of anticipated thicknesses 54, including in one example thicknesses 54 between about 1 mm and about 15 mm or greater. In one embodiment, the height 52 can be such that the headliners 16 have thicknesses 54 of up to about 12 mm and at least 3 mm. In the current example, this can be accomplished configuring the tab 30 and the associated features of the housing 22 such that the height 52 is at least 12 mm.

With reference to FIGS. 7-11, the particular operation by which the tab 30 is moved from the retracted position 40 to the engaged position 48 is described in further detail. As mentioned above, the tab 30 is operably coupled with the housing 22 by an actuator in the form of the screw 38. As shown in FIG. 6, an operable end 58 of the screw 38 is disposed along a side 56 or surface of module 10 along the housing 22 that extends over, or within, the hole 20 when the housing 22 is received therein. Accordingly, the housing 22 can be positioned within the hole 20, as shown in FIG. 5, with operable ends 58 of the screws 38 available for operation by a user. As shown in FIGS. 8A, 8B, 9A, and 9B, rotation of the screws 38, such as by turning using a screwdriver or the like, can initially cause the tabs 30 to rotate outwardly from the housing 22. To accommodate such movement, the screws 38 can be configured such that they do not threadably engage with the housing 22, but are otherwise secured in position relative thereto, while being freely rotatable. Such a configuration can be such that the threadable engagement between the screw 38 and the threaded hole 36 provides sufficient friction such that initial rotation of screw 38 causes the illustrated rotation of the tab 30 into the extended position 42 (FIGS. 9A and 9B).

Figure 9A:
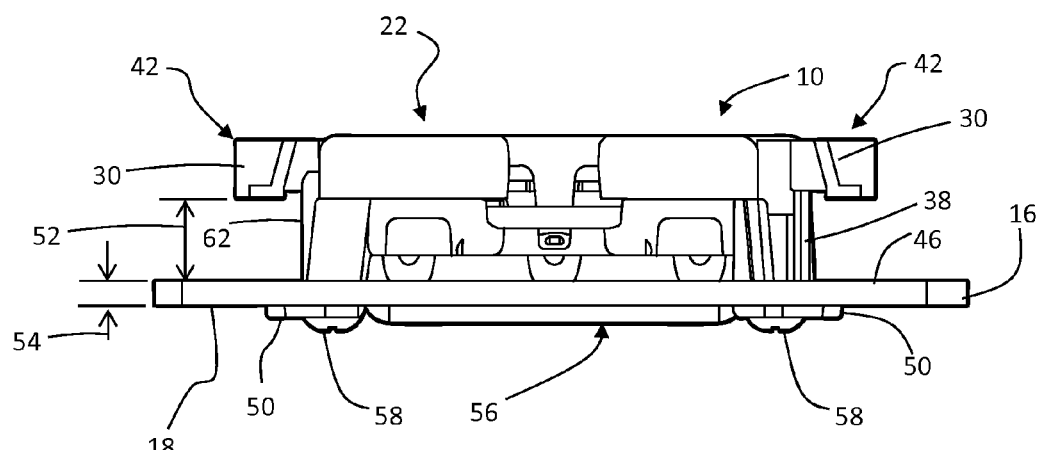
FIG. 9A shows a front view of the remote garage door opener module of FIG. 4 during a subsequent step of the movement sequence depicted in FIG. 7.
Figure 9B:
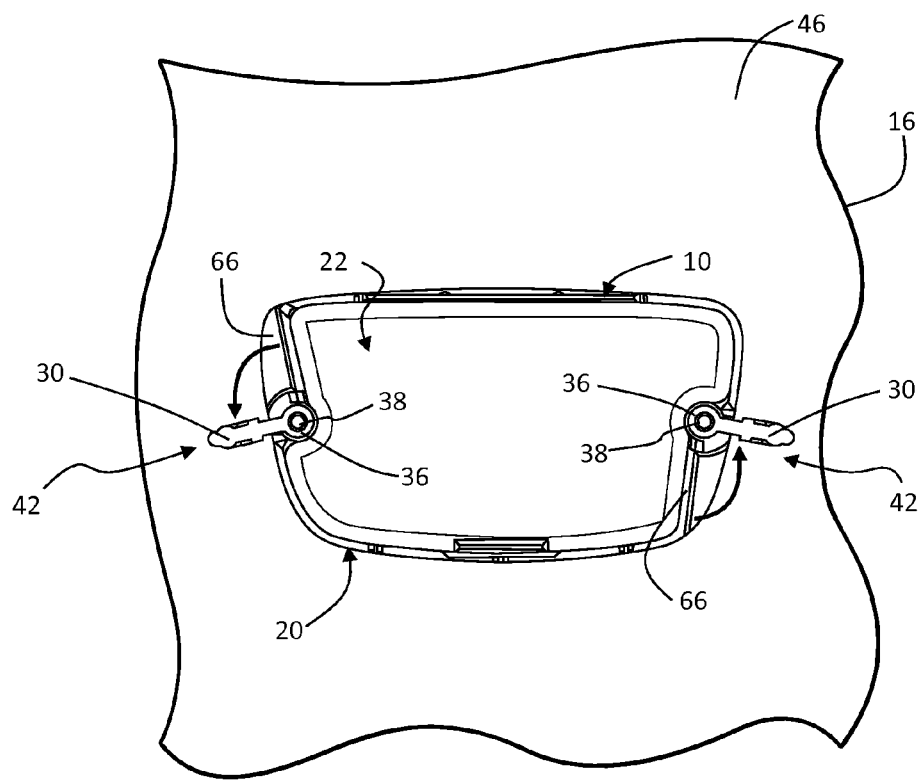
FIG. 9B shows a top view of the remote garage door opener module during the movement sequence step of FIG. 9A.

As illustrated in FIGS. 7 and 9B, the housing 22 defines a guide track 60 therein in which a portion of the tab 30 is rotatably received and within which the tab 30 rotates during movement of the retracted position 40 to the extended position 42. A blocking edge 62 of the guide track 60 is positioned relative to the housing 22 such that when the tab 30 reaches the extended position 42, further rotation thereof is inhibited by the blocking edge 62. Accordingly, in such a position further rotation of the screw 38 will cause the threads of the screw 38 to rotate with respect to the threaded hole 36, thereby drawing the tab 30 onto the screw 38, which causes linear movement of the tab 30 toward the engaged position 48. Depending on the particular thickness 54 of the headliner 16, variations in the number of turns needed by the screw 38 for the tab 30 to reach the engaged position 48 may vary.

Figure 11:
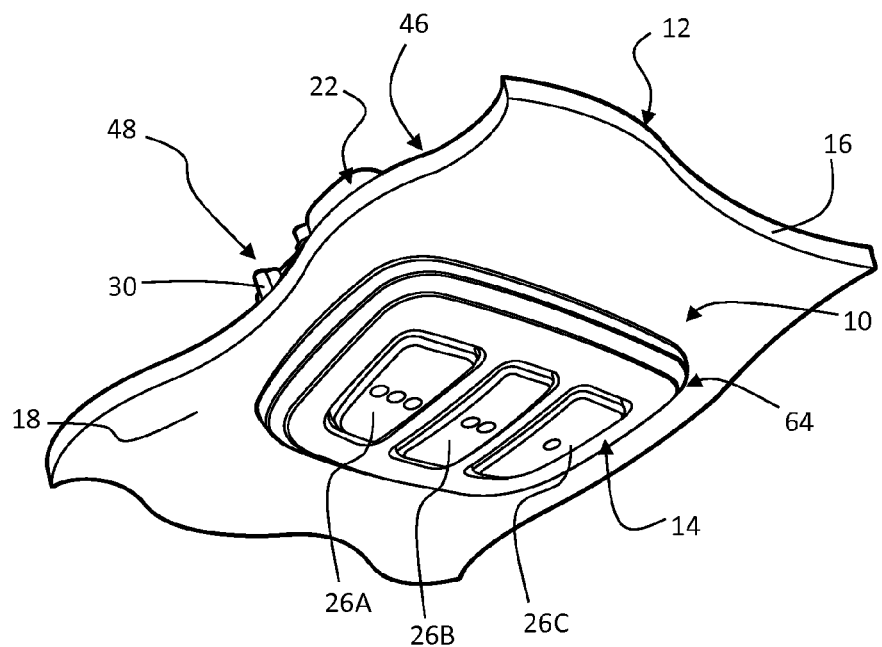
FIG. 11 shows the remote garage door opener module of FIG. 4 assembled with a portion of a vehicle headliner.

As illustrated in FIG. 5, for example, the operable ends 58 of the screws 38 may be positioned along the side 56 of the housing 22 such that they are within the outer periphery 44 of the bezel 14. Such a configuration allows for the bezel 14 to obscure the screws 38 from view, when the module 10 is assembled with the headliner 16. In such a configuration, the bezel 14, along with the button 26 (of which three buttons 26A, 26B, and 26C are depicted) may be included in a cover unit 64 that is removably coupled with the housing 22, such as by the incorporation of interengaging snap features or the like. Accordingly, as shown in FIG. 5, the housing 22 can be assembled with the headliner 16 with the cover unit 64 disassembled therefrom such that the operable ends 58 of the screws 38 are available for access to move the tabs 30 from the retracted position 40, through the extended position 42 and into the engaged position 48 by the above-described turning thereof. After such assembly of the housing 22 with the headliner 16, the cover unit 64 can be assembled therewith to conceal the operable ends 58 of the screws 38, such that the module 10 is fully-assembled with respect to the headliner 16, and thus, with the vehicle 12, as shown in FIG. 11.

Figure 12:
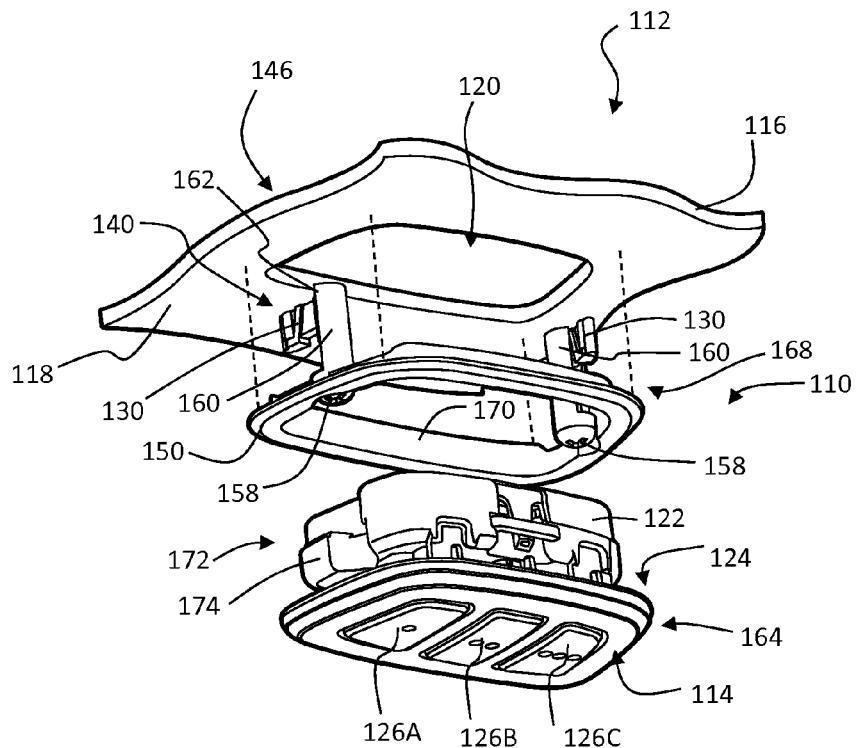
FIG. 12 shows an assembly view of another variation of the remote garage door opener module of FIG. 1 during a step of assembly thereof with a portion of a vehicle headliner.
Figure 13:
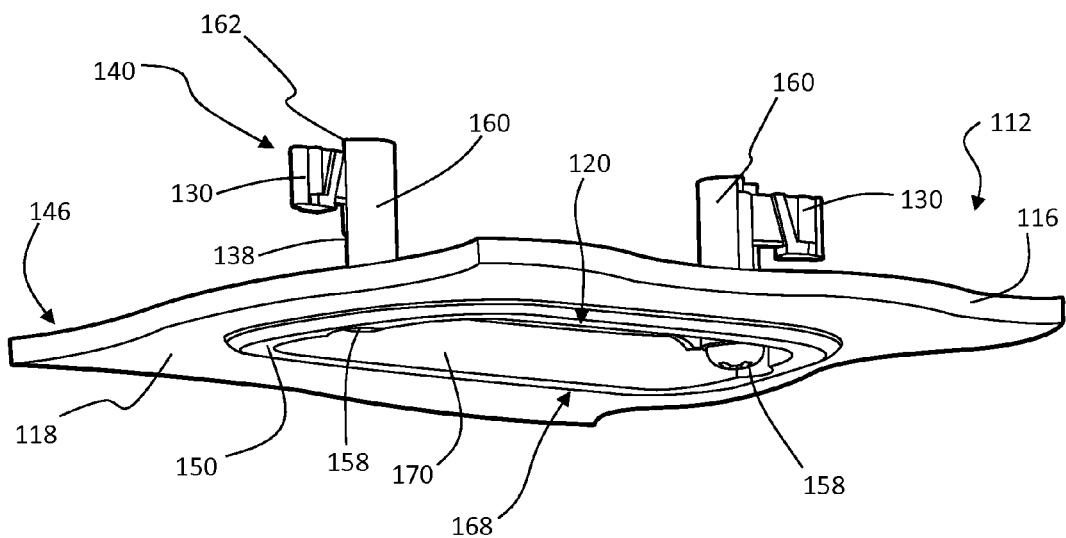
FIG. 13 shows a perspective view of a portion of the remote garage door opener module of FIG. 12 during a subsequent assembly step.
Figure 14:
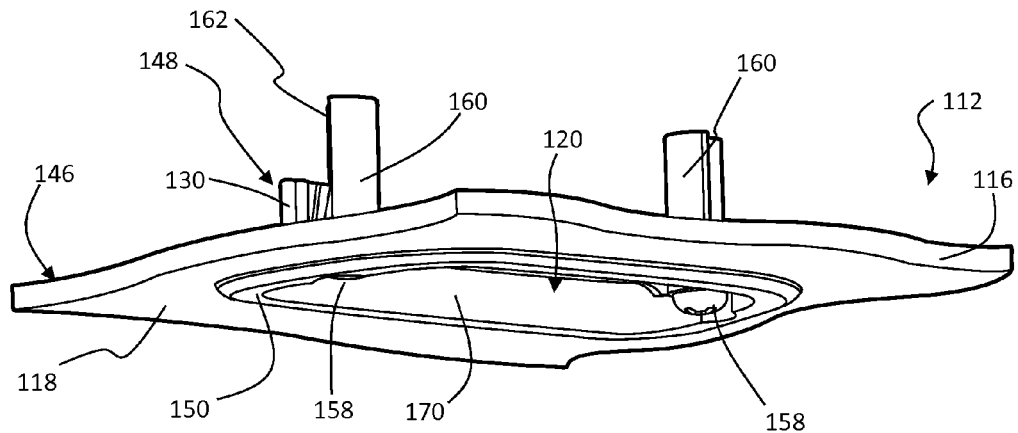
FIG. 14 shows a perspective view of a portion of the remote garage door opener module of FIG. 12 during another subsequent assembly step.

FIGS. 12-15 illustrate a variation of a module 110 that is similar to the module 10 shown in FIGS. 1-11 and is configured for assembly with a headliner 116 in a manner similar, and in similar locations, to the module 10, as depicted in FIG. 3. As shown in FIG. 12, the module 110 includes a mounting element in the form of a tab 130 that is generally similar to the tab 30 described above with respect to FIGS. 1-11. In the variation of FIG. 12, however, the module 110 includes a mounting unit 168 that is separate from and releasably coupleable with a housing 122, such that the housing 122 can be initially pre-assembled with buttons 126A, 126B, and 126C, along with a bezel 114 already assembled therewith. As further shown in FIG. 12, a flange 150 can be incorporated onto the mounting unit 168 so as to extend from a ring 170 such that the mounting unit 168 can be assembled into a hole 120 of the headliner 116, as shown in FIG. 13, with at least a portion of the ring 170 disposed within the hole 120, and with the flange 150 extending outwardly along a surface 146 of the headliner 116.

The mounting unit 168 is further configured with a guide track 160 extending away therefrom and into the hole 120 so as to be positionable behind the surface 146 of the headliner 116, as shown in FIG. 13. In an example, the ring 170, the flange 150, and the guide tracks 160 can be integrally formed from a single piece of material, such as plastic or the like. As further depicted, actuation elements in the form of screws 138 can be received within the mounting unit 168 in the manner similar to that with which the screws 38 are coupled with the housing 22 in the example described above with reference to FIGS. 1-11. Accordingly, the tabs 130 having threaded holes 136 therein can be operably engaged with the screws 138 so as to be moveable from a retractable position 140, as shown in FIG. 13, through an extended position 142 (FIG. 14), and continuing to an engaged position 148, as shown in FIG. 15, by manipulation, including turning or rotating, of the screws 138 at operable ends 158 thereof, which are accessible to a user along a side 156 of the mounting unit 168, when assembled with the headliner 116.

Figure 15:
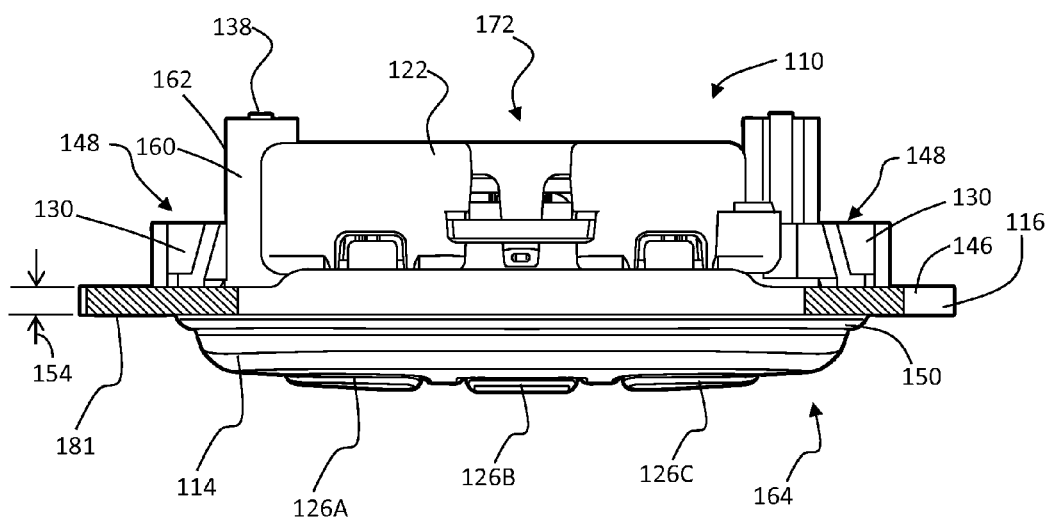
FIG. 15 shows a front, partial cross-sectional view of the remote garage door opener module of FIG. 12 assembled with a headliner of a vehicle.

As further shown in FIG. 15, when the tabs 130 have been moved into the engaged position 148, such that a portion of the headliner 116 is captured between the tabs 130 and the flange 150, the assembly 172 of the housing 122 with buttons 126A, 126B and 126C, and the bezel 114 can be assembled with the mounting unit 168 such that the module 110 is fully assembled with the headliner 116, and accordingly, with the vehicle 112. As shown in FIG. 12, one or more pressure tabs 174 can be coupled with so as to extend from the housing 122 such that the assembly 172 can be snapped into a coupled arrangement with the mounting unit 168. In a variation from the example shown in FIGS. 12-15, bezel 14 can be sized to extend over so as to cover flange 150 and further such that a portion thereof contacts surface 118 of headliner 116.

A further example of a module 210 configured for assembly with a headliner 216 of a vehicle 212, in a manner similar to that which is described above and depicted in FIG. 3, is shown in FIGS. 16-19. As illustrated, the module 210 includes a housing 222 to which a separate cover unit 264 (FIG. 19) is removably coupled thereto. Similarly, the housing 222 is generally configured such that it can be positioned within a hole 220 of a headliner 216 with a flange 250 extending outwardly from the hole 220 so as to extend along and contact the interior 218 thereof. The module 210 includes actuation elements in the form of screws 238 that are retained with the housing 222 so as to be rotatably coupled therewith in a manner similar to the screws 38, described above. The screws 238 are configured to drive movement of mounting elements in the form of flaps 276 that extend from the housing 222. In an example, the flaps 276 can be coupled with the housing 222 by being integrally formed therewith a living hinge 277 joining the flaps 276 to the housing 222 such that the flaps 276 are rotatable in a direction toward the flange 250. In other examples, flaps 276 can be coupled with housing 222 by various mechanical hinges having separate portions affixed respectively to the flaps 276 and housing 222.

Figure 16:
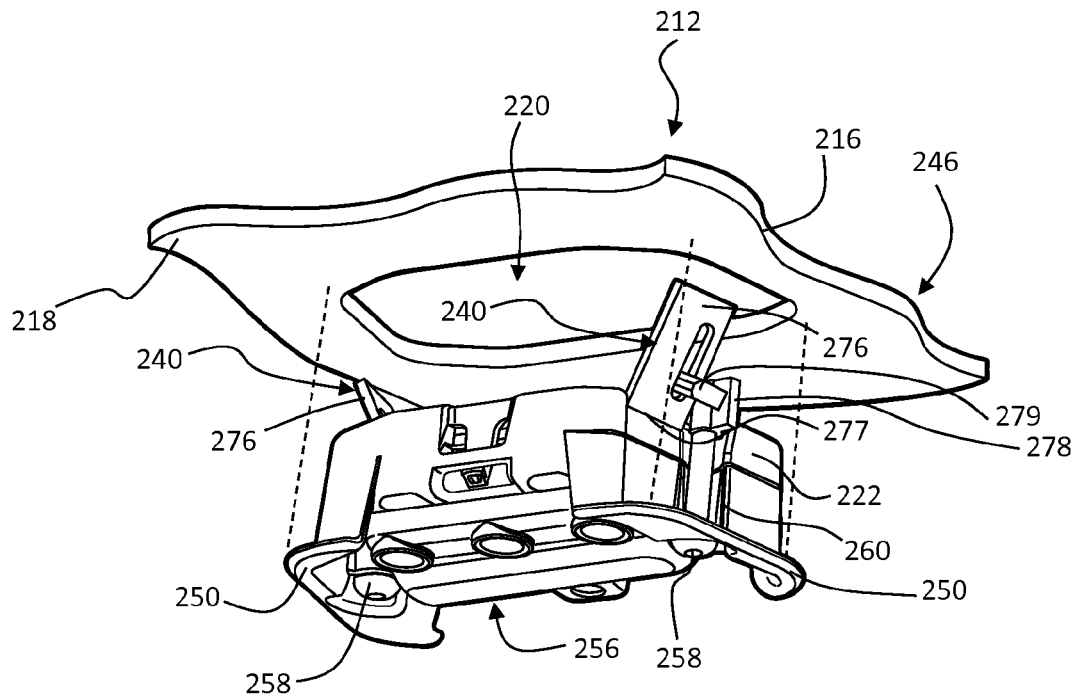
FIG. 16 shows an assembly view of a portion of another variation of the remote garage door opener module of FIG. 1 during a step of assembly thereof with a portion of a vehicle headliner.
Figure 17:
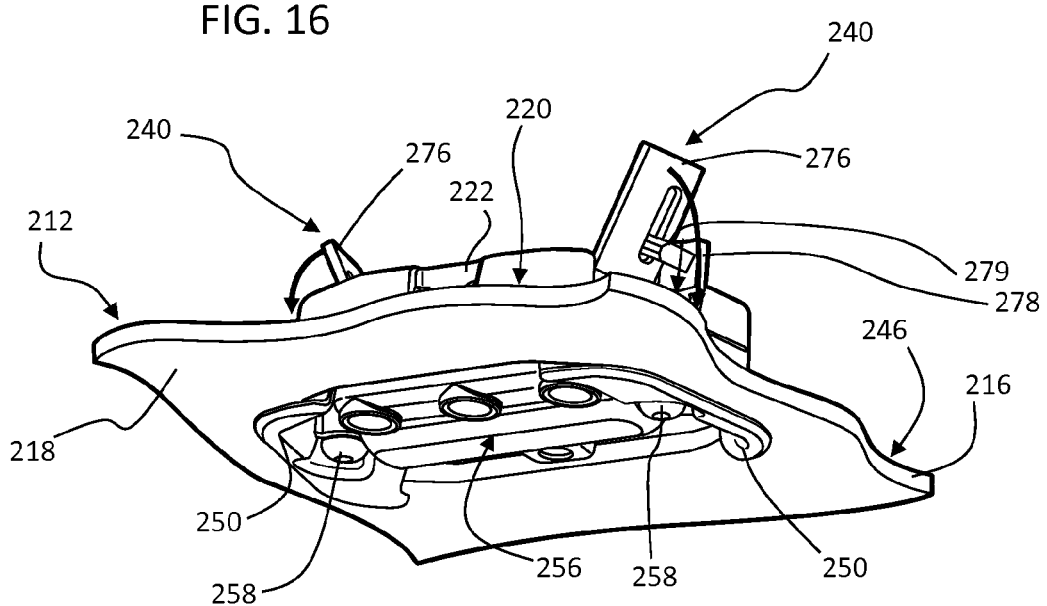
FIG. 17 shows a perspective view of the remote garage door opener module portion of FIG. 12 during a subsequent assembly step.
Figure 18:
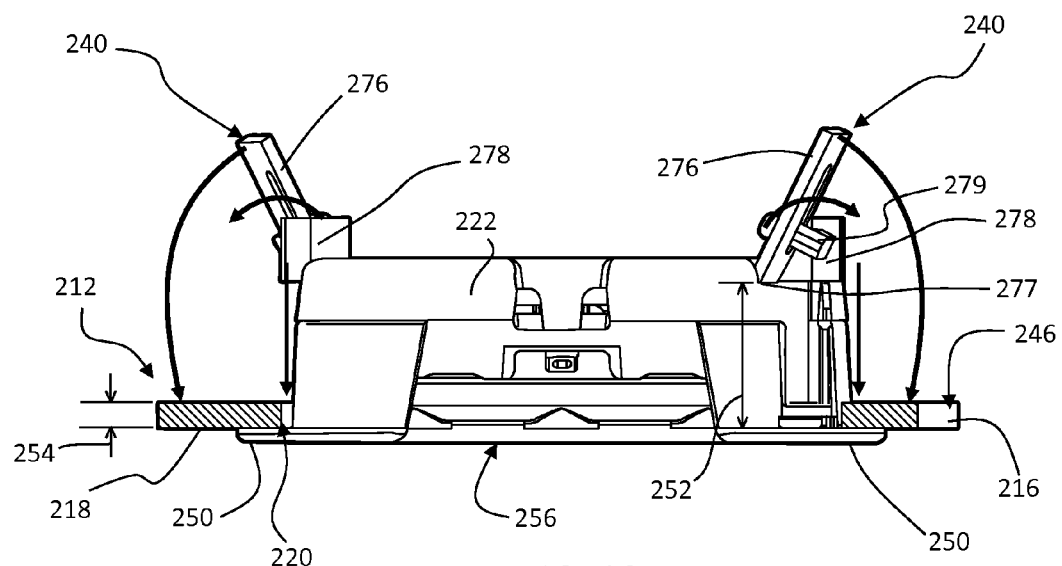
FIG. 18 shows a front view of the remote garage door opener module portion of FIG. 17.
Figure 19:
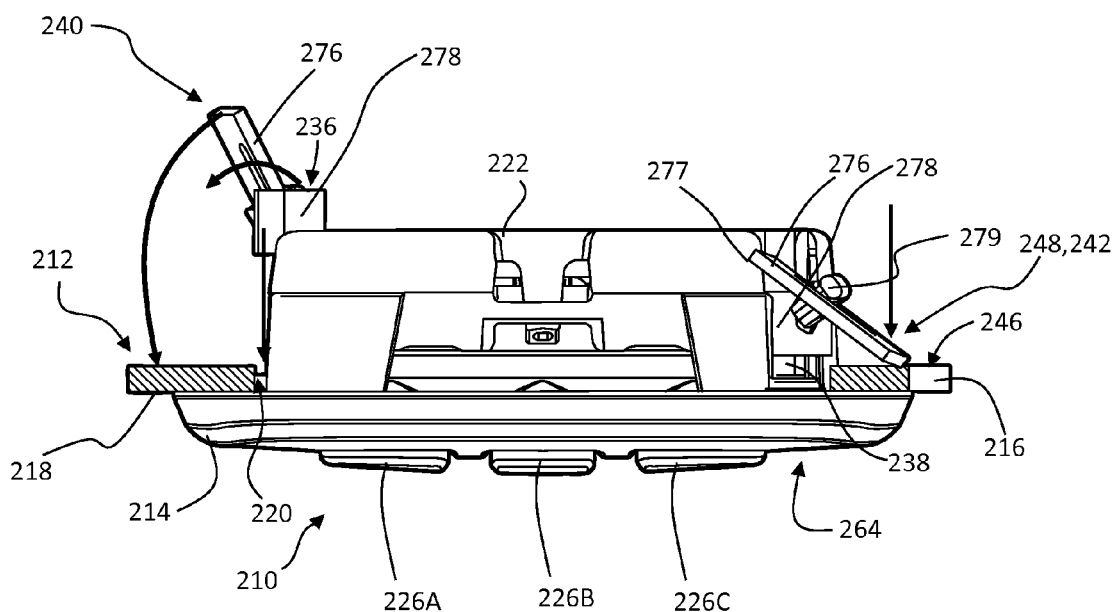
FIG. 19 shows a front view of the remote garage door opener module portion of FIG. 18 during another subsequent assembly step.

As shown in FIGS. 16 and 17, a retracted position 240 of the flaps 276 is such that the flaps 276 extend upwardly with respect to the housing 222 (i.e., any direction away from the flange 250) at a distance sufficient for the flaps 276 to be disposed inwardly of the flange 250. As shown in FIGS. 18 and 19, the flaps 276 are moveable through the extended position 242 and into an engaged position 248 by a singular rotational movement of the flaps 276 with respect to the housing 222. As mentioned above, such movement is driven by rotation of the screws 238 with respect to the housing 222 at operable ends 258 thereof, which are positioned along a side 256 of the housing 222 so as to be accessible by a user. Such movement is achieved by coupling of the flaps 276 to the respective screws 238 by corresponding link bodies 278 and link arms 279. As shown, the link body 278 is disposed within a guide track 260 (FIG. 16) and includes a threaded hole 236 with which the screw 238 is engaged such that appropriate rotation of the screw 238 causes movement of the link body 278 towards the flange 250.

The link arm 279 is rotatably coupled with the link body 278 such that movement of the link body 278 towards the flange 250 causes corresponding downward movement of the link arm 279, which is, in turn, operably coupled with the flap 276. Accordingly, downward movement of the link body 278, as driven by rotation of the screw 238 causes the link arm 279 to rotate the flap 276 along the depicted path and into the engaged position 248, as depicted in FIG. 19. As previously mentioned, the link arm 279 is rotatably coupled with the link body 278 to help accommodate such movement. Various headliners 216 of varying thicknesses 254 can be accommodated by such a mechanism by positioning the living hinge 277 at a height 252 of at least about 12 mm from the flange 250, such that the flap 276 is at least generally parallel with the flange 250 when the module 210 is assembled with a relatively thick headliner 216. In other examples, flap 276 can be made to retain module 210 to still thicker headliners by increasing the height above flange 250 at which hinge 277 is positioned. As shown in FIG. 19, after movement of the flap 276 into the engaged positioned 248, the cover unit 264 can be assembled with the housing 222 such that a fully assembled module 210 is assembled with the headliner 216.

FIGS. 20-22 depict a further variation of a module 310 having a separate housing 322 and a cover unit 364 and configured such that the housing 322 can be assembled within a hole 320 of the headliner 316 such that flanges 350, which extend integrally from the housing 322 are positioned along a surface 346 of the headliner 316 with mounting elements in the form of ratchet clips 380 that are engageable with an interior 318 of the headliner 316. As illustrated, the ratchet clips 380 include a mounting body 381 slidably engaged with respective guide tracks 360 of the housing 322. Each guide track 360 is positioned adjacent a pawl 383 that is configured to engage with teeth 382 formed along the mounting body 381. The engagement of the pawl 383 with the teeth 382 can be configured such that the ratchet clip 380 is moveable from an extended position 342, shown in FIG. 20, with a face 384 of the ratchet clip 380 disposed away from the flange 350 to the engaged position 348, in which the face 384 is positioned adjacent to and in contact with the interior 318 of the headliner 316.

Further, the engagement of pawl 383 with the teeth 382 serves to retain the face 384 against the interior 318 of the headliner 316 such that the headliner 316 can be captured between the face 384 of the ratchet clip 380 and the flange 350 to retain the housing 322 with the headliner 316. As shown in FIG. 21 such a housing 322 can be moved into an assembled position within the hole 320 by moving each flange 350 separately into the hole 320 and over respective portions of the surface 346 of the headliner 316 with the ratchet clips 380 being somewhat flexible to accommodate any translational movement of the housing 322 to appropriately position the flanges 350. After assembly of the housing 322 within the hole 320, the ratchet clips 380 can be moved into the engaged position 348 by a force exerted on the ratchet clips 380 in the area of the face 384 to move the face 384 into contact with the interior 318 of the headliner 316. Subsequently, the cover unit 364 can be assembled with the housing 322 such that the module 310 is fully assembled with the headliner 316.

Figure 23:
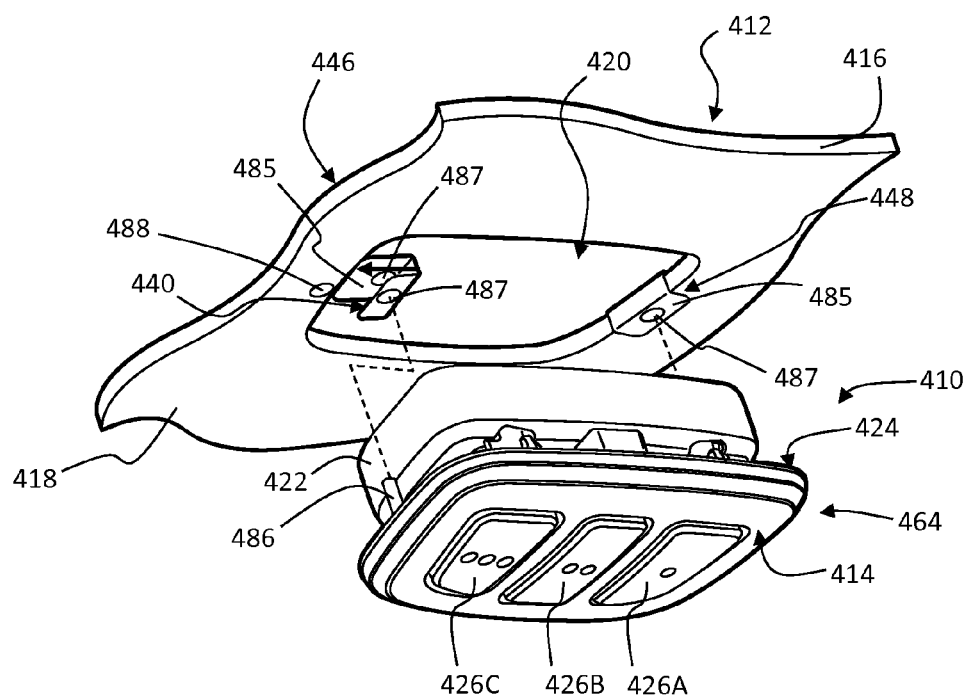
FIG. 23 shows an assembly view of a another variation of the remote garage door opener module of FIG. 1 during a step of assembly thereof with a portion of a vehicle headliner.
Figure 24:
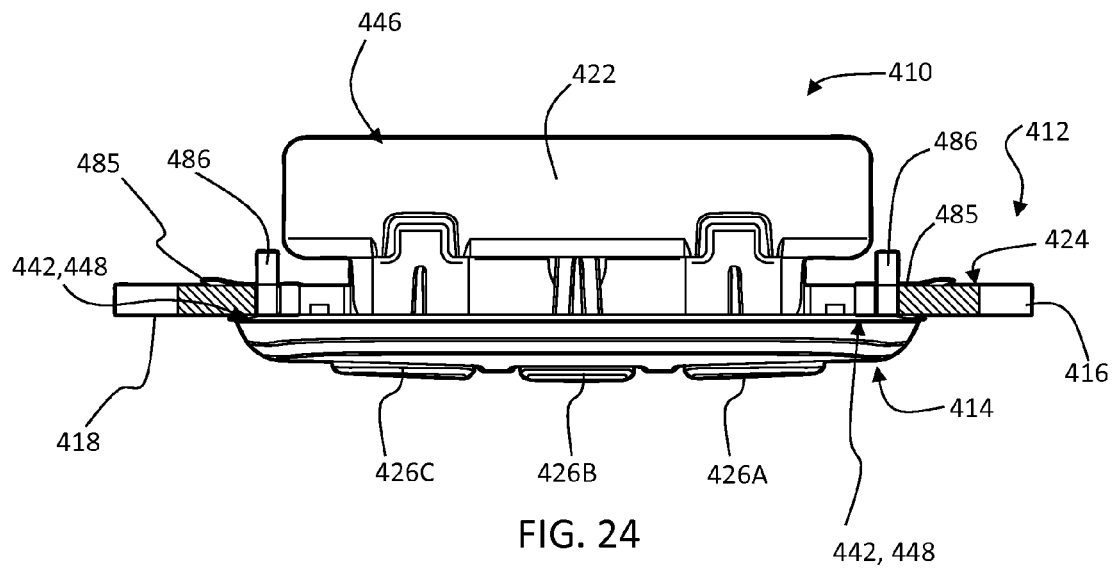
FIG. 24 shows a front, partial sectional view of the remote garage door opener module of FIG. 23 assembled with the vehicle headliner portion.

FIGS. 23 and 24 show a further variation of a module 410 in which the module 410 can be assembled with a hole 420 of a headliner 416 as a single unit including a housing 422 and a cover unit 464 in a pre-assembled manner. Specifically, the module 410 is provided with one or more clips 485 that are configured to be assembled with the headliner 416 in the area of the hole 420 so as to extend around from the interior 418 of the headliner 416 over a surface 446 thereof. In an example, a plurality of pairs of clips 485 can be provided with the module 410 in varying sizes, for example, small, medium, and large, to be assembled with the headliners 416 of sizes that are within a range that generally corresponds to the particular clip 485.

The module 410 can include a plurality of posts 486, corresponding in number to the intended number of clips 485 to be used to retain the module 410. The post 486 can extend from either of the housing 422 or a bezel 414, and are configured to extend in a direction generally perpendicular to a surface 424 of the bezel 414. The posts 486 are used to retain the module 410 to the headliner 416 by engagement thereof with corresponding holes 487 in the clips 485. The holes 487 and the posts 486 can be sized to form a press-fit arrangement therebetween. Optionally, the clips 485 can be configured with various structures to help retain the post 486 in an assembled position therewith. For example, the clip 485 can include a flexible arm or the like positioned adjacent to the hole 487 to extend into contact with the post 486, and can further be made of a thin, metal material so as to partially engage with a corresponding surface of post 486.

As shown in FIG. 23, the one or more clips 485 can be placed in a retracted position 440 adjacent to headliner 416 within the hole 420 and can be moved to an extended position 442 in which they are engaged with the headliner 416. At this point, the module 410 can be moved such that the housing 422 passes at least partially through the hole 420 and the posts 486 engaged with the corresponding holes 487 of the clips 485. It is noted that secondary holes 488 may be made in the headliner 416 adjacent to the hole 420 to provide for clearance of the posts 486 during assembly of the holes 487. Alternatively, the hole 420 can be extended in such areas. Such movement of the module 410 is continued until the bezel 414 is brought into contact with the interior 418 of the headliner 416, thus fully assembling the module 410 with the headliner 416.

Figure 25:
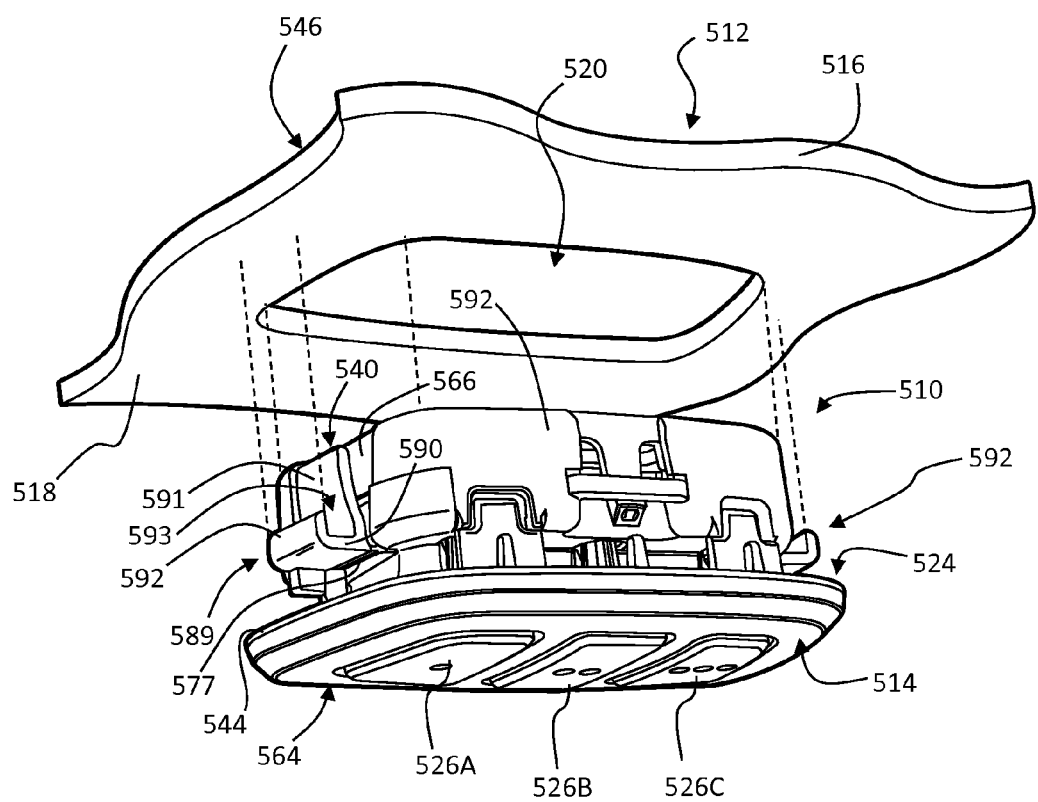
FIG. 25 shows an assembly view of another variation of the remote garage door opener module of FIG. 1 during a step of assembly thereof with a portion of a vehicle headliner.
Figure 26:
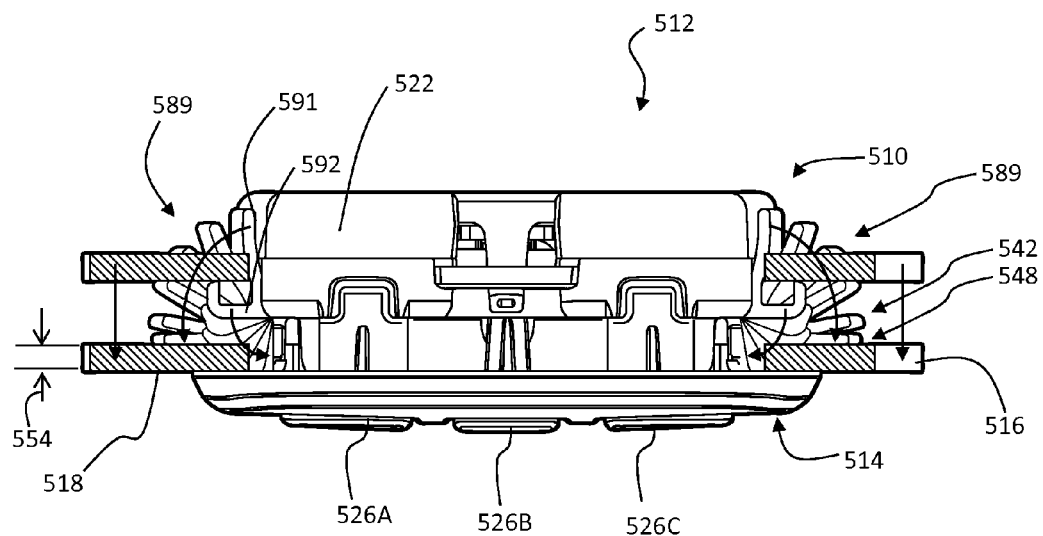
FIG. 26 shows a front, partial section view of the remote garage door opener module of FIG. 25 illustrating the relative movements of various portions thereof during assembly with the headliner portion.
Figure 27:
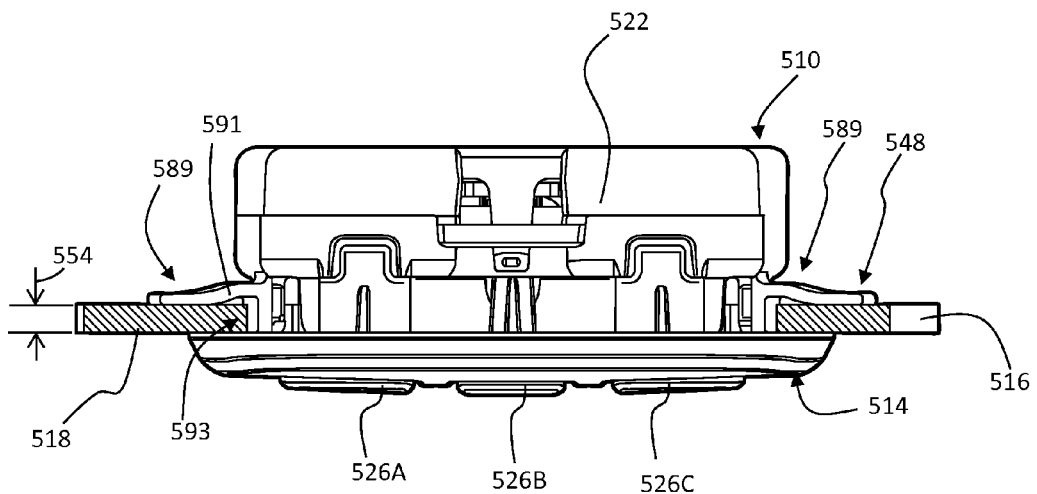
FIG. 27 shows a front, partial cross-sectional view of the remote garage door opener module of FIG. 25 assembled with the headliner portion.

A further variation of a module 510 is shown in FIGS. 25-27, and includes a pair of oppositely-positioned spring fingers 589 operatively coupled with a housing 522 to provide a snap-in configuration for the module 510 such that the module 510 can be assembled with a hole 520 and a headliner 516 in a single unit including the housing 522 and a cover unit 564. As shown, each spring finger 589 includes a body 590 coupled with the housing 522 at a location therealong by a hinge, depicted as a living hinge 577 herein, such that the body 590 can rotate in the direction indicated in FIG. 26. The body 590 of the spring finger 589 includes a retainer tab 591 and an actuator tab 592 that are rigidly coupled together so as to be spaced apart from each other and to define a gap 593 therebetween. As shown, in a retracted position 540, the retainer tabs 591 extend upwardly along the housing 522 so as to be positioned inwardly of an outer periphery 544 of a bezel 514, and optionally within a recess 566 thereof. Further, when in the retracted position 540, actuator tabs 592 are positioned outwardly of the housing 522 so as to be, for example, adjacent to the outer periphery 544 of the bezel 514 (e.g., within about 2 mm in either direction thereof). Further, the spring fingers 589 can be spring-biased at least toward the extended position 542, shown in FIG. 27. Such spring-biasing can be toward the extended position 542 and away from a retracted position 540, in which case the housing 522 can, for example, include a tab or other similar features so as to temporarily retain the spring fingers 589 in the retracted position 540, when desired by snapping them into such a position. When released from engagement with the snap tabs (i.e. by the force of the headliner 516 against the actuator tab 592), the spring biasing toward the extended 542 and/or engaged positions 548. Alternatively, the spring fingers 589 can be spring-biased away from a midpoint between the retracted position 540 and the extended position 542 such that, for example, they are biased toward the retracted position 540 until crossing such a mid-point, whereby they will be biased toward the extended position 542.

As shown in FIG. 25, the location of the retainer tabs 591 when the spring fingers 589 are in the retracted position 540 is such that the housing 522 can be moved into and pass partially through the hole 520 in the headliner 516 with the retainer tabs 591 also passing at least partially through the hole 520. As shown in FIG. 26, the actuator tabs 592 will then be brought into contact with the interior 518 of the headliner 516 as the module 510 is continued to be moved (e.g. by pressing module 510 into the hole 520) such that the bezel 514 advances toward the headliner 516. Further movement of the module 510, which as depicted in FIG. 26 moves the headliner 516 in the indicated direction relative to the module 510, exerts a force on the actuator tabs 592, which causes rotation of the bodies 590 about the hinge 577. This movement is such that the spring fingers 589 are moved toward the extended position 542 to receive a portion of the headliner 516 in the area of the hole 520 within gap 593. The spring-biasing of the spring fingers 589 thus urges the retainer tabs 591 into contact with the surface 546 of the headliner 516, and further urges the bezel 514 into contact with the interior 518 of the bezel 514 such that the headliner 516 is captured between the retainer tab 591 and the bezel 514. Accordingly, when the headliner 516 is present between the retainer tab 591 and the bezel 514, the extended position 542 of the spring fingers 589 will coincide with the engaged position 548 thereof. As shown in FIG. 27, this arrangement serves to retain the module 510 in assembly with the headliner 516.

Figure 28:
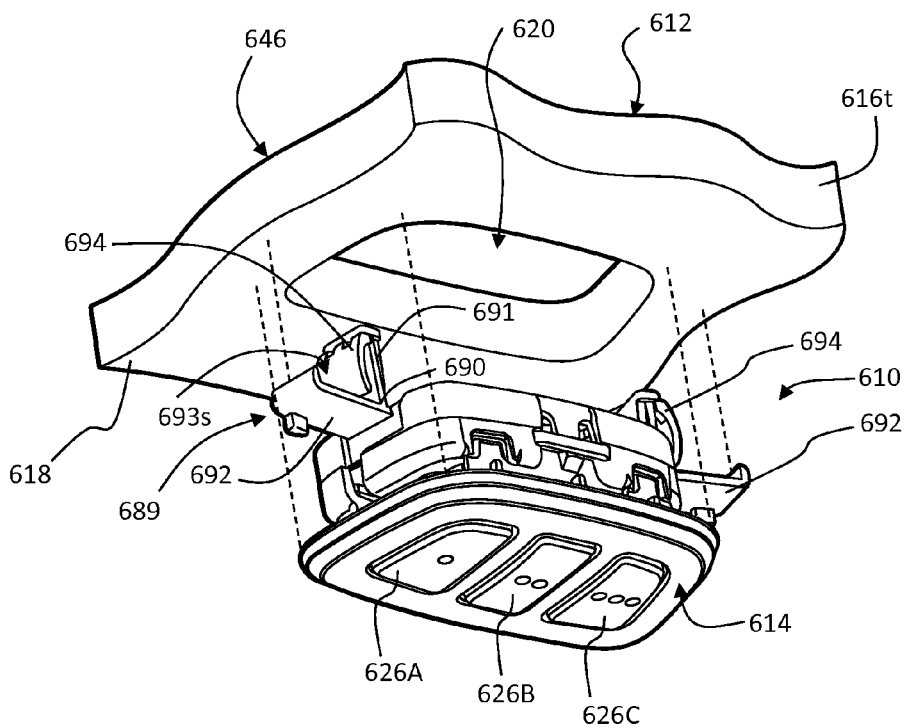
FIG. 28 shows an assembly view of another variation of the remote garage door opener module of FIG. 1 during a step of assembly thereof with a portion of a vehicle headliner.
Figure 29:
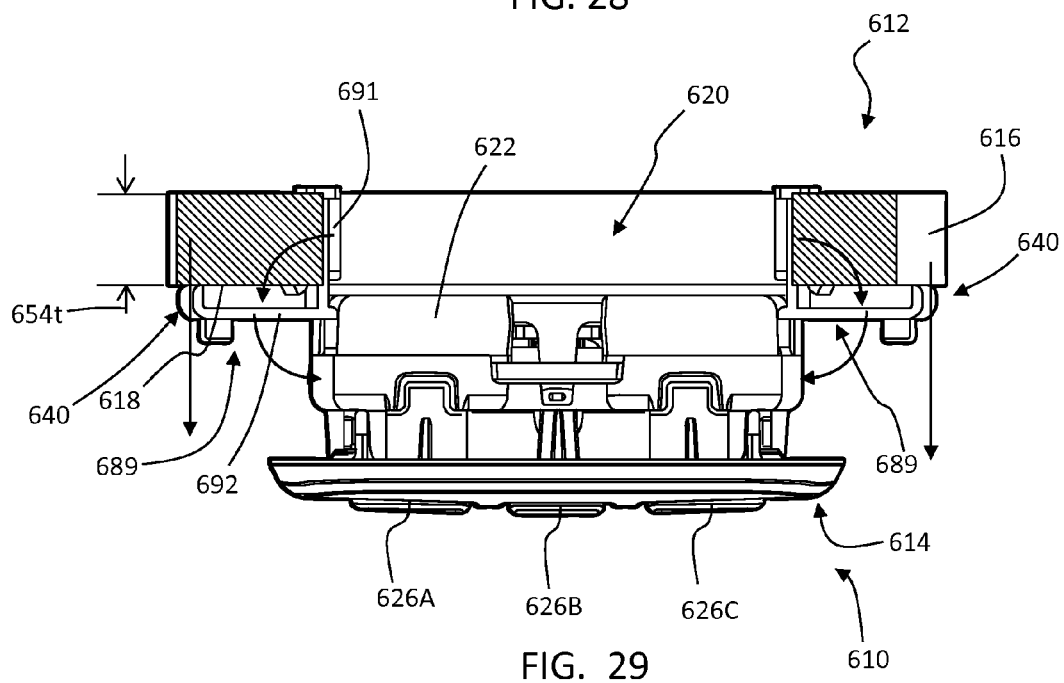
FIG. 29 shows a front, partial cross-sectional view of the remote garage door opener module of FIG. 28 during a subsequent assembly step.
Figure 30:
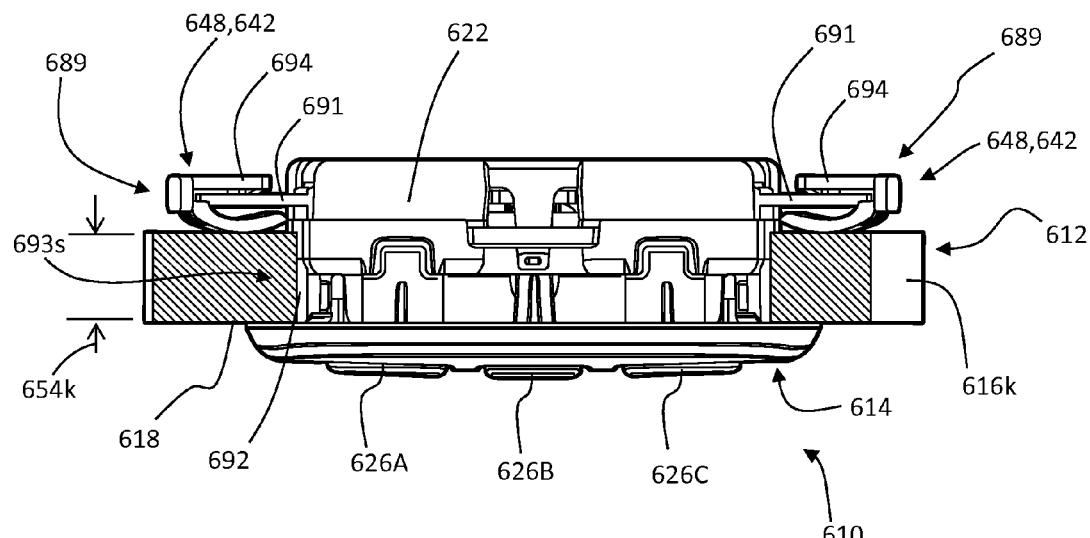
FIG. 30 shows a front, partial cross-sectional view of the remote garage door opener module of FIG. 29 during another subsequent assembly step.
Figure 31:
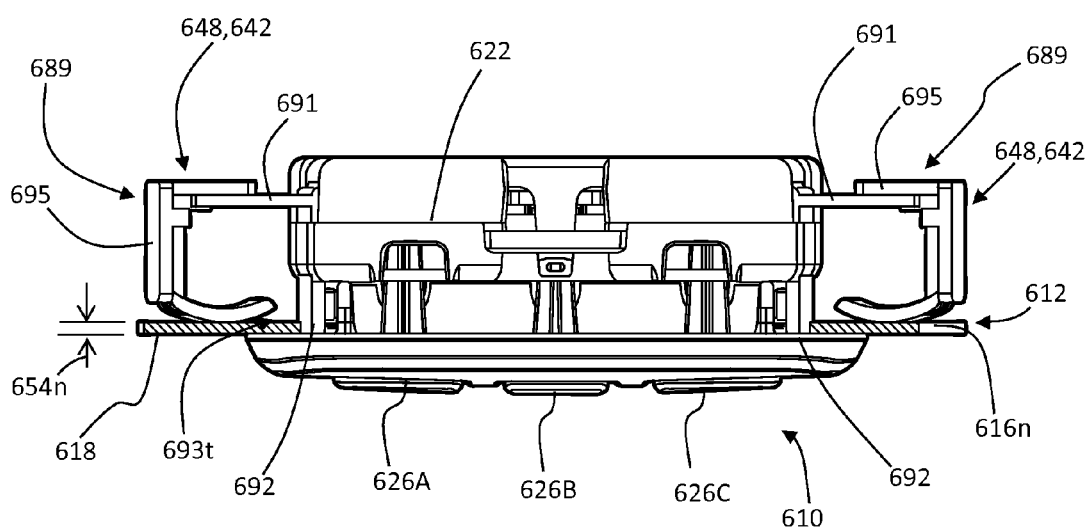
FIG. 31 shows a front, partial cross-sectional view of the remote garage door opener module of FIG. 28 according to a variation thereof assembled with a different vehicle headliner portion.

FIGS. 28-31 show a variation of a module 610 that is similar to the module 510, as described with respect to FIGS. 25-27, and includes oppositely positioned spring fingers 689 operably coupled with a housing 622, such as by living hinges 677. Similarly, bodies 690 of the spring fingers 689 include respective actuator tabs 692 and retainer tabs 691, configured to cause movement of the spring fingers 689 between a retracted position 640 and an extended position 642 as the module 610 is moved into a position in which the housing 622 is passed partially through a hole 620 in a headliner 616*t*. The spring fingers 689 included in the present example of the module 610 further include respective retainer extensions that can be provided in a variety of sizes, for example short retainer extensions 694, as shown in FIG. 30, and tall retainer extensions 695, as shown in FIG. 31. By assembly of selected ones of the variously sized retainer extensions, the size of a gap 693 can be adjusted, so as to permit the spring fingers 689 to receive variously sized headliners 616*t* within the gap 693 for assembly of the module 610 therewith. For example, as shown in FIGS. 28-30 when short retainer extensions 694 are assembled with the retainer tabs 691, a relatively large (e.g., between 8 and 12 mm) headliner 616*k* can be received within gap 693*s* to permit the assembly of the module 610 therewith, as depicted in FIG. 29. In a variation, as shown in FIG. 31, tall retainer extensions 695 can be assembled with the retainer tabs 691 such that a headliner 616*n* of a relatively low thickness (e.g., between 3 and 6 mm) can be received within gaps 693*t* for assembly of the module 610 therewith. Further sizes of retainer extensions, for example, between the depicted sizes of short retainer extensions 694 and long retainer extensions 695, can be provided in a kit with the module 610 for selection thereof by an installer based on the thickness 654*t*, 654*k* of the particular headliner 616*t*, 616*n* with which the module 610 is to be installed.

A general method for installing a module of the type described above is discussed with respect to module 10, as depicted in FIGS. 1-11. In such a method, an installer can first determine a desired location for installation of the module 10 within the headliner 16, such as within the areas 2, 4, and 6, as shown in FIG. 3, which can be based on the desires of the user of the vehicle 12, the available space for the module 10, such as between other elements on or adjacent to the headliner 16, and the interior area between the headliner 16 and the roof panel. The hole 20 can then be cut in the headliner 16 in the desired location 2, 4, or 6, for example, and in an appropriate size to receive the housing 22 therethrough and such that the hole 20 is obscured by the bezel 14 which would be over sized relative to the formed hole 20. The hole 20 can be formed by various processes and with various tools or instruments, including drills, routers, saws, various clips or scissors, knives, or the like. In one example, an ultrasonic saw is used to form the hole 20. Further, a template or other guide can be used to ensure appropriate sizing and shape for the hole 20, which can vary depending on the particular variation of the modules 10, 110, 210, 310, 410, 510, or 610, in accordance with the particular assembly steps and principles associated therewith, as discussed above.

Subsequent to formation of the hole 20, the particular module can be aligned with housing, such as the housing 22, passing at least partially through the hole 20, at which point (or before, as in the case of the module 510, discussed above) the particular mounting element can be moved from the retracted position, for example retracted position 40 to the engaged position, for example engaged position 48, by operation of an actuation element, such as the screws 38, or by appropriate movement of the corresponding bezel, for example the bezel 14, toward the associated headliner, for example the headliner 16. Optionally, such a method can further include assembly of a cover unit, such as the cover unit 64 with the housing 22. After making any further adjustments to the positioning of the module 10 with respect to the hole 20, installation of the module 10 within the vehicle 12 is complete.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, the bezel of the module disclosed herein may take on a variety of shapes and could be flat, curved, bent, etc. Further, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A remote garage door opener module for assembly into a vehicle and transmitting signals to a garage door opener, the module comprising:
   a bezel positionable against a headliner of the vehicle along an interior surface thereof in a position over a hole in the headliner;
   a housing enclosing a power source and electronic circuitry for transmitting the signals, the housing extending away from a first side of the bezel and positionable at least partially through the hole in the headliner;
   a button exposed at a second side of the bezel and coupled to the electronic circuitry; and
   a mounting element selectively engageable with the headliner adjacent the hole and coupled with one of the housing or the bezel for coupling the module with the headliner, and
   wherein the mounting element is moveable with respect to the housing between a retracted position and an extended position, the retracted position being such that the mounting element is disposed inwardly of an outer periphery of the bezel.

2. The remote garage door opener module of claim 1, wherein:
   the mounting element is coupled with the housing so as to be rotatable in a direction toward and away from the bezel; and
   the mounting element includes:
      a retainer tab that extends away from the bezel when the mounting element is in the retracted position and outwardly from the housing when the mounting element is in the extended position; and
      an actuator tab rigidly coupled with the retaining tab and having at least a portion extending outwardly away from the housing when the mounting element is in the retracted position and extending along a portion of the housing when the mounting element is in the extended position.

3. The remote garage door opener module of claim 1, wherein the retracted position is further such that the mounting element is disposed inwardly of an outer periphery of the bezel by at least about 2 mm.

4. The remote garage door opener module of claim 1, wherein:
   the housing defines a recess; and
   the retracted position is further such that at least a portion of the mounting element is disposed within the recess.

5. The remote garage door opener module of claim 1, wherein the mounting element is selectively engageable with the headliner at least partially by movement of the mounting element between the retracted position and the extended position.

6. The remote garage door opener module of claim 1, wherein:
   the housing defines a first surface positionable over the hole in the vehicle headliner; and
   the mounting element is coupled with an actuation element having an operable end disposed along the first surface of the module such that the mounting element is selectively engageable by manipulation of the operable end of the actuation element.

7. The remote garage door opener module claim 6, wherein the mounting element is selectively engageable with the headliner at least partially by movement of the mounting element toward and away from the first surface.

8. The remote garage door opener module of claim 6, wherein:
   the bezel is coupled with the buttons in a cover unit; and
   the bezel is removably coupled with the housing such that the operable end of the actuation element can be selectively exposed or concealed by the cover unit.

9. The remote garage door opener module of claim 1, wherein the mounting element is a portion of a mounting unit that is selectively coupleable with the housing.

10. The remote garage door opener module of claim 1, wherein engagement of the mounting element with the headliner adjacent the hole is such that a portion of the headliner adjacent the hole is captured between the mounting element and one of the bezel, or a flange extending outwardly from the housing.

* * * * *